United States Patent
Lopatin et al.

(10) Patent No.: US 7,736,928 B2
(45) Date of Patent: *Jun. 15, 2010

(54) PRECISION PRINTING ELECTROPLATING THROUGH PLATING MASK ON A SOLAR CELL SUBSTRATE

(75) Inventors: Sergey Lopatin, Morgan Hill, CA (US); John O. Dukovic, Palo Alto, CA (US); David Eaglesham, Livermore, CA (US); Nicolay Y. Kovarsky, Sunnyvale, CA (US); Robert Bachrach, Burlingame, CA (US); John Busch, San Jose, CA (US); Charles Gay, Westlake Village, CA (US)

(73) Assignee: Applied Materials, Inc., Santa Clara, CA (US)

( * ) Notice: Subject to any disclaimer, the term of this patent is extended or adjusted under 35 U.S.C. 154(b) by 745 days.

This patent is subject to a terminal disclaimer.

(21) Appl. No.: 11/566,205

(22) Filed: Dec. 1, 2006

(65) Prior Publication Data

US 2008/0132082 A1    Jun. 5, 2008

(51) Int. Cl.
*H01L 21/20* (2006.01)

(52) U.S. Cl. .............. 438/48; 438/49; 438/52; 438/55; 438/57; 257/E21.101; 257/E21.122; 257/E21.131; 257/E21.134; 257/E21.175; 257/E25.007; 257/E31.033; 257/E31.039; 257/E31.126; 257/E33.008; 117/89; 117/92; 117/93; 117/97

(58) Field of Classification Search .............. 438/48, 438/49–57, 81, 88–97, 166, 486; 117/89–97, 117/913; 257/E21.101, 122, 131, 134, 175, 257/E25.007, E31.033, 38, 39, 126, E33.008

See application file for complete search history.

(56) References Cited

U.S. PATENT DOCUMENTS

| 3,849,880 A | 11/1974 | Haynos |
| 4,240,880 A | 12/1980 | Tsuchibuchi et al. |
| 4,436,558 A | 3/1984 | Russak |
| 4,581,108 A | 4/1986 | Kapur et al. |

(Continued)

OTHER PUBLICATIONS

International Search Report, May 8, 2008.

(Continued)

*Primary Examiner*—Michael S Lebentritt
(74) *Attorney, Agent, or Firm*—Patterson & Sheridan

(57) ABSTRACT

Embodiments of the invention contemplate the formation of a low cost solar cell using a novel electroplating apparatus and method to form a metal contact structure having metal lines formed using an electrochemical plating process. The apparatus and methods described herein remove the need to perform the often costly processing steps of performing a mask preparation and formation steps, such as screen printing, lithographic steps and inkjet printing steps, to form a contact structure. The resistance of interconnects formed in a solar cell device greatly affects the efficiency of the solar cell. It is thus desirable to form a solar cell device that has a low resistance connection that is reliable and cost effective. Therefore, one or more embodiments of the invention described herein are adapted to form a low cost and reliable interconnecting layer using an electrochemical plating process containing a common metal, such as copper. Embodiments of the invention may provide an apparatus and method of forming a solar cell device that utilizes a reusable masking device during one or more electrochemical deposition steps.

25 Claims, 23 Drawing Sheets

U.S. PATENT DOCUMENTS

| | | | |
|---|---|---|---|
| 4,617,420 A | 10/1986 | Dilts et al. | |
| 4,623,751 A | 11/1986 | Kishi et al. | |
| 4,666,567 A | 5/1987 | Loch | |
| 4,789,437 A | 12/1988 | Sing et al. | |
| 4,869,971 A | 9/1989 | Nee et al. | |
| 5,057,163 A | 10/1991 | Barnett et al. | |
| 5,198,965 A | 3/1993 | Curtis et al. | |
| 5,209,817 A | 5/1993 | Ahmad et al. | |
| 5,277,786 A * | 1/1994 | Kawakami | 205/124 |
| 5,575,855 A | 11/1996 | Kanai et al. | |
| 5,588,994 A * | 12/1996 | Bozler et al. | 117/89 |
| 5,841,197 A | 11/1998 | Adamic et al. | |
| 5,897,368 A | 4/1999 | Cole, Jr. et al. | |
| 5,968,333 A | 10/1999 | Nogami et al. | |
| 5,972,192 A | 10/1999 | Dubin et al. | |
| 6,103,085 A | 8/2000 | Woo et al. | |
| 6,197,181 B1 | 3/2001 | Chen | |
| 6,261,433 B1 | 7/2001 | Landau | |
| 6,294,822 B1 * | 9/2001 | Nakata | 257/461 |
| 6,297,155 B1 | 10/2001 | Simpson et al. | |
| 6,299,745 B1 | 10/2001 | Kumar et al. | |
| 6,391,166 B1 | 5/2002 | Wang | |
| 6,406,610 B1 | 6/2002 | Lowe | |
| 6,447,938 B1 * | 9/2002 | Bianchi | 428/698 |
| 6,559,479 B1 * | 5/2003 | Ludemann | 257/99 |
| 6,572,742 B1 | 6/2003 | Cohen | |
| 6,610,189 B2 | 8/2003 | Wang et al. | |
| 6,670,543 B2 * | 12/2003 | Lohmeyer et al. | 136/258 |
| 6,706,166 B2 | 3/2004 | Chou et al. | |
| 6,881,318 B2 | 4/2005 | Hey et al. | |
| 7,172,184 B2 * | 2/2007 | Pavani et al. | 269/37 |
| 7,339,110 B1 * | 3/2008 | Mulligan et al. | 136/256 |
| 7,388,147 B2 | 6/2008 | Mulligan et al. | |
| 2003/0192583 A1 | 10/2003 | Ryan | |
| 2003/0230337 A1 | 12/2003 | Gaudiana et al. | |
| 2004/0067324 A1 | 4/2004 | Lazarev et al. | |
| 2004/0074762 A1 | 4/2004 | Keigler et al. | |
| 2004/0118446 A1 | 6/2004 | Toyomura | |
| 2004/0198187 A1 | 10/2004 | Tolles | |
| 2004/0200520 A1 | 10/2004 | Mulligan et al. | |
| 2005/0061665 A1 | 3/2005 | Pavani et al. | |
| 2005/0103377 A1 | 5/2005 | Saneyuki et al. | |
| 2005/0121326 A1 | 6/2005 | Klocke et al. | |
| 2005/0199489 A1 | 9/2005 | Stevens et al. | |
| 2005/0272263 A1 | 12/2005 | Brabec et al. | |
| 2006/0033678 A1 | 2/2006 | Lubomirsky et al. | |
| 2006/0062897 A1 | 3/2006 | Gu et al. | |
| 2006/0174935 A1 | 8/2006 | Sawada et al. | |
| 2006/0185714 A1 | 8/2006 | Nam et al. | |
| 2006/0185716 A1 | 8/2006 | Murozono et al. | |
| 2006/0207885 A1 | 9/2006 | Basol | |
| 2006/0217049 A1 | 9/2006 | Li et al. | |
| 2006/0219565 A1 | 10/2006 | Preusse et al. | |
| 2006/0223300 A1 | 10/2006 | Simka et al. | |
| 2008/0092947 A1 * | 4/2008 | Lopatin et al. | 136/255 |
| 2008/0121276 A1 * | 5/2008 | Lopatin et al. | 136/256 |
| 2008/0128013 A1 * | 6/2008 | Lopatin et al. | 136/244 |
| 2008/0128019 A1 * | 6/2008 | Lopatin et al. | 136/252 |
| 2008/0128268 A1 * | 6/2008 | Lopatin et al. | 204/192.1 |

OTHER PUBLICATIONS

Popov, et al., "The Relationship Between the Effective Current Density and the Effective Overpotential in Copper Deposition by the Pulsating Potential", Institute of Chemistry, Technology and Metallurgy, Beograd, Yugoslavia, Journal of Applied Electrochemistry 4 (1974), pp. 267-273.

Puippe, et al., "The Morphology of Pulse-Plated Deposits", Plating and Surface Finishing, Jun. 1980, pp. 68-72, (Based on a presentation made at the AES International Symposium on Pulse Plating, Apr. 19-20, 1979).

Kray, et al "High-Efficiency Emitter-Wrap-Through Cells", 17th EU-PVSEC Munich (2001), Paper 0A8.1, pp. 1-4.

Eager, et al. "Environmentally Friendly Processes in the Manufacture of Saturn Solar Cells", 2002 IEEE, pp. 62-65.

Domeier, et al. "Microscreen-based Replication of Electroforming Micromolds", Microsystem Technologies 8 (2002), pp. 78-82.

Fredenberg, et al. "Recent Progress in the Development of ECPR (ElectroChemical Pattern Replication) Metal Printing for Microelectronics", 208th ECS Meeting, Oct. 16-21, 2005, Los Angeles, California, Abstract #682.

Weeber, et al. "How to Achieve 17% Cell Efficiencies on Large Back-Contacted Mc-Si Solar Cells", 2006 IEEE 4th World Conference on Photovoltaic Energy Conversion, May 7-12, 2006, Hawaii, pp. 1-4.

Granek, et al. "A Systematic Approach to Reduce Process-Induced Shunts in Back-Contacted Mc-Si Solar Cells", 2006 IEEEE 4th World Conference on Photovoltaic Energy Conversion, May 7-12, 2006 Hawaii, pp. 1-4.

Lee, et al. "Correlation of Stress and Texture Evolution During Self- and Thermal Annealing of Electroplated Cu Films", 2000 IEEE, pp. 114-116.

Lee, et al. "Evidence of Dislocation Loops as a Driving Force for Self-Annealing in Electroplated Cu Films", 2001 IEEE, pp. 236-238.

Lopatin, et al. "Electroless Cu and Barrier Layers for Sub-Half Micron Multilevel Interconnects", SPIE vol. 3214, pp. 21-32.

Eikelbloom, et al. "Conductive Adhesives for Low-Stress Interconnection of Thin Back-Contact Solar Cells", 29th IEEE Photovoltaic Specialists Conference, May 20-24, 2002, New Orleans, pp. 1-4, http://www.ecn.nl/docs/library/report/2002/rx02052.pdf.

Schubert, et al. "Flexible Solar Cells for Clothing", Materials Today, Jun. 2006, vol. 9 No. 6, pp. 42-50.

International Search Report. Sep. 19, 2008.

PCT International Search Report and Written Opinion dated Apr. 9, 2009, International Application No. PCT/US07/85959.

Prosecution History for U.S. Appl. No. 11/566,202.

* cited by examiner

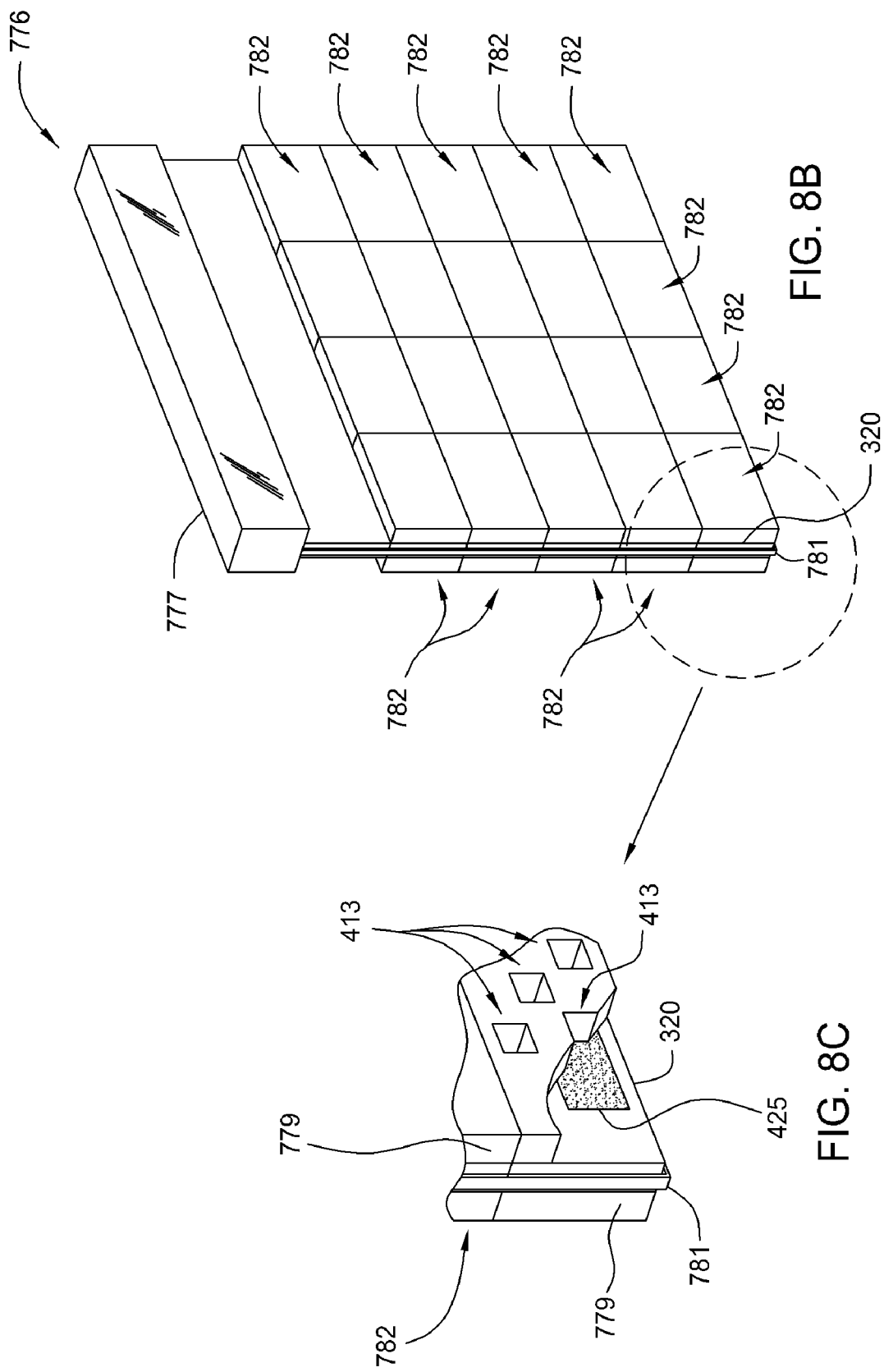

ps://example.com

PRECISION PRINTING ELECTROPLATING THROUGH PLATING MASK ON A SOLAR CELL SUBSTRATE

CROSS-REFERENCE TO RELATED APPLICATIONS

This application is related to the U.S. patent application entitled "High Aspect Ratio Anode And Apparatus For High-Speed Electroplating On A Solar Cell Substrate" by Sergey Lopatin et al. Ser. No. 11/566,202, filed Dec. 1, 2006, the U.S. patent application entitled "Method Of Metallizing A Solar Cell Substrate" by Sergey Lopatin et al. Ser. No. 11/566,201, filed Dec. 1, 2006, and the U.S. patent application entitled "Electroplating On Roll-to-Roll Flexible Solar Cell Substrates" by Sergey Lopatin et al. Ser. No. 11/566,200, filed Dec. 1, 2006, which are all herein incorporated by reference.

BACKGROUND OF THE INVENTION

1. Field of the Invention

Embodiments of the present invention generally relate to the fabrication of photovoltaic cells and particularly to the formation of layers on a substrate by use of an electrochemical deposition process.

2. Description of the Related Art

Solar cells are photovoltaic devices that convert sunlight directly into electrical power. The most common solar cell material is silicon, which is in the form of single or polycrystalline wafers. Because the amortized cost of forming a silicon-based solar cells to generate electricity is higher than the cost of generating electricity using traditional methods, there has been an effort to reduce the cost to form solar cells.

FIGS. 1A and 1B schematically depicts a standard silicon solar cell 100 fabricated on a wafer 110. The wafer 110 includes a p-type base region 101, an n-type emitter region 102, and a p-n junction region 103 disposed therebetween. An n-type region, or n-type semiconductor, is formed by doping the semiconductor with certain types of elements (e.g., phosphorus (P), arsenic (As), or antimony (Sb)) in order to increase the number of negative charge carriers, i.e., electrons. Similarly, a p-type region, or p-type semiconductor, is formed by the addition of trivalent atoms to the crystal lattice, resulting in a missing electron from one of the four covalent bonds normal for the silicon lattice. Thus the dopant atom can accept an electron from a neighboring atoms' covalent bond to complete the fourth bond. The dopant atom accepts an electron, causing the loss of half of one bond from the neighboring atom and resulting in the formation of a "hole".

When light falls on the solar cell, energy from the incident photons generates electron-hole pairs on both sides of the p-n junction region 103. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the frontside 120, i.e. the light-receiving side, and the backside 121 of the solar cell 100. The top contact structure, as shown in FIG. 1A, is generally configured as widely-spaced thin metal lines, or fingers 104, that supply current to a larger bus bar 105. The back contact 106 is generally not constrained to be formed in multiple thin metal lines, since it does not prevent incident light from striking solar cell 100. Solar cell 100 is generally covered with a thin layer of dielectric material, such as $Si_3N_4$, to act as an anti-reflection coating 111, or ARC, to minimize light reflection from the top surface of solar cell 100.

In the interest of simplified assembly and higher efficiency of solar cells, a solar cell has been developed, wherein a plurality of holes is formed through the solar cell substrate and serves as vias for interconnection of the top contact structure to a backside conductor by using pins. This solar cell design is referred to as a pin-up module, or PUM. One advantage of the PUM concept is the elimination of the busbars, such as bus bar 105 illustrated in FIG. 1A, from covering the light-receiving side of the substrate, thereby increasing efficiency of the cell. Another is that resistive losses are reduced because current produced by the solar cell is collected at holes equally spaced over the substrate rather than requiring some of the connections to extend across the surface of the solar cell. Further, resistive losses experienced by a PUM connected device will not increase as the solar cell surface area increases and, hence, larger solar cells may be manufactured without a loss in efficiency.

FIG. 1C is a partial schematic cross section of one example of a PUM cell 130 showing a contact 134. Similar to a standard solar cell, such as solar cell 100, PUM cell 130 includes a single crystal silicon wafer 110 with a p-type base region 101, an n-type emitter region 102, and a p-n junction region 103 disposed therebetween. PUM cell 130 also includes a plurality of through-holes 131, which are formed between the light-receiving surface 132 and the backside 133 of PUM cell 130. The through-holes 131 allow the formation of contact 134 between the light-receiving surface 132 and the backside 133. Disposed in each through-hole 131 is a contact 134, which includes a top contact structure 135 disposed on light-receiving surface 132, a backside contact 136 disposed on backside 133, and an interconnect 137, which fills through-hole 131 and electrically couples top contact structure 135 and backside contact 136. An anti-reflective coating 107 may also be formed on light-receiving surface 132 to minimize reflection of light energy therefrom. A backside contact 139 completes the electrical circuit required for PUM cell 130 to produce a current by forming an ohmic contact with p-type base region 101 of wafer 110.

The fingers 104 (FIG. 1B) or contact 134 (FIG. 1C) are in contact with the substrate are adapted to form an ohmic connection with doped region (e.g., n-type emitter region 102). An ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts are critical for the performance of the solar cell and reliability of the circuits formed in the solar cell fabrication process. Hence, after the fingers 104, or contacts 134, have been formed on the light-receiving surface and on the backside, an annealing process of suitable temperature and duration is typically performed in order to produce the necessary low resistance metal silicide at the contact/semiconductor interface. A backside contact completes the electrical circuit required for solar cell to produce a current by forming an ohmic contact with p-type base region of the substrate.

Wider the current carrying metal lines (e.g., fingers 104, contact 134) are on the light-receiving surface of the solar cell the lower the resistance losses, but the higher the shadowing losses due to the reduced effective surface area of the light-receiving surface. Therefore, maximizing solar cell efficiency requires balancing these opposing design constraints. FIG. 1D illustrates a plan view of one example of a top contact structure 135 for a PUM cell, wherein the finger width and geometry have been optimized to maximize cell efficiency for the cell. In this configuration, a top contact structure 135 for a PUM cell is configured as an electrode 138, which consists of a plurality of various width finger segments 135A. The width of a particular finger segment 135A is selected as a function of the current to be carried by that finger segment 135A. In addition, finger segments 135A are configured to branch as necessary to maintain finger spacing as a function of finger width. This minimizes resistance losses as well as shadowing by finger segments 135A.

Traditionally, the current carrying metal lines, or conductors, are fabricated using a screen printing process in which a silver-containing paste is deposited in a desired pattern on a substrate surface and then annealed. However, there are several issues with this manufacturing method. First, the thin fingers of the conductors, when formed by the screen printing process, may be discontinuous since the fingers formed using a metal paste do not always agglomerate into a continuous interconnecting line during the high temperature annealing process. Second, porosity present in the fingers formed during the agglomeration process results in greater resistive losses. Third, electrical shunts may be formed by diffusion of the metal (e.g., silver) from the contact into the p-type base region or on the surface of the substrate backside. Shunts on the substrate backside are caused by poor definition of backside contacts such as waviness, and/or metal residue. Fourth, due to the relatively thin substrate thicknesses commonly used in solar cell applications, such as 200 micrometers and less, the act of screen printing the metal paste on the substrate surface can cause physical damage to the substrate. Lastly, silver-based paste is a relatively expensive material for forming conductive components of a solar cell.

One issue with the current method of forming metal interconnects using a screen printing process that utilizes a metal particle containing paste is that the process of forming the patterned features requires high temperature post-processing steps to densify the formed features and form a good electrical contact with the substrate surface. Due to the need to perform a high temperature sintering process the formed interconnect lines will have a high extrinsic stress created by the difference in thermal expansion of the substrate material and the metal lines. A high extrinsic stress, or even intrinsic stress, formed in the metal interconnect lines is an issue, since it can cause breakage of the formed metallized features, warping of the thin solar cell substrate, and/or delamination of the metallized features from the surface of the solar cell substrate. High temperature processes also limit the types of materials that can be used to form a solar cell due to the breakdown of certain materials at the high sintering temperatures. Also, screen printing processes also tend to be non-uniform, unreliable and often unrepeatable. Therefore, there is a need to form a low stress interconnect line that forms a strong bond to the surface of the substrate.

Another approach to forming very thin, robust current carrying metal lines on the surface of a solar cell substrate involves cutting grooves in the surface of the substrate with a laser. The grooves are subsequently filled by an electroless plating method. However the laser-cut grooves are a source of macro- and micro-defects. The laser-cut edge is not well defined, causing waviness on the finger edges, and the heat of the laser introduces defects into the silicon.

Therefore, there is a need for a low cost method of forming a contact structure for solar cells that have a low resistivity and clearly defined features.

SUMMARY OF THE INVENTION

Embodiments of the present invention generally provide an apparatus for forming a metal layer on a solar cell substrate, comprising a masking plate having a body, a first surface, a second surface and a plurality of apertures that extend through the body between the first surface and the second surface, a contact that is in communication with a power supply, a thrust plate that is adapted to urge a substrate against the contact and the first surface of the masking plate, and an electrode that is in electrical communication with the power supply.

Embodiments of the present invention may further provide an apparatus for forming a metal layer on a solar cell substrate, comprising a masking plate having a body, a first surface, a second surface and a plurality of apertures that extend through the body between the first surface and the second surface, a contact that is in communication with a power supply, a thrust plate that is adapted to urge a substrate against the contact and the first surface of the masking plate, and an electrode that is in electrical communication with the power supply and that is sealably connected to masking plate so that a plurality of processing volumes are formed by a surface of the electrode and the apertures formed in the masking plate.

Embodiments of the present invention may further provide an apparatus for forming a metal layer on a solar cell substrate, comprising a contact that is in electrical communication with a power supply, a masking plate having a body, a first surface, a second surface, wherein the masking plate comprises a plurality of apertures that extend through the body between the first surface and the second surface, wherein each of the plurality of apertures have a sidewall surface, and a plurality of inlet channels, wherein each of the plurality of apertures is in fluid communication with at least one inlet channel and each inlet channel has an inlet port which is in fluid communication with the sidewall surface, and a first electrolyte source that is in fluid communication with at least one of the plurality of inlet channels, a thrust plate that is adapted to urge a substrate against the contact and the first surface of the masking plate, and an electrode that is in electrical communication with the power supply.

Embodiments of the present invention may further provide a method of forming a metal layer on a solar cell substrate, comprising positioning a substrate that has a seed layer that is in electrical communication with a n-type region or a p-type region formed on a substrate in a processing apparatus, disposing a masking plate having a plurality of apertures formed therein over the surface and at least a portion of the seed layer, contacting the seed layer with one or more electrical contacts, and forming a first metal layer over the seed layer by immersing the seed layer and an electrode in a first electrolyte and biasing the electrical contacts relative to the electrode using a power supply, wherein the first metal layer is formed within the areas exposed by apertures formed in the masking plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be

FIG. 8B illustrates an isometric view of a head assembly according to one embodiment described herein.

FIG. 8C illustrates a close-up isometric view of the head assembly illustrated in FIG. 8B according to one embodiment described herein.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a low cost solar cell using a novel electroplating method and apparatus to form a metal contact structure having selectively formed metal lines using an electrochemical plating process. The apparatus and methods described herein remove the need to perform one or more high temperature screen printing processes to form conductive features on the surface of a solar cell substrate. Solar cell substrates that may benefit from the invention include substrates composed of single crystal silicon, multi-crystalline silicon, polycrystalline silicon, germanium (Ge), and gallium arsenide (GaAs), cadmium telluride (CdTe), cadmium sulfide (CdS), copper indium gallium selenide (CIGS), copper indium selenide (CuInSe$_2$), gallilium indium phosphide (GaInP$_2$), as well as heterojunction cells, such as GaInP/GaAs/Ge or ZnSe/GaAs/Ge substrates. The solar cell substrates may be formed in a square, rectangular, circular or any other desirable shape.

The resistance of interconnects formed in a solar cell device greatly affects the efficiency of the solar cell. It is thus desirable to form a solar cell device that has a low resistance connection that is reliable and cost effective. As noted above, silver (Ag) interconnecting lines formed from a silver paste is one of the currently the preferred interconnecting method. However, while silver has a lower resistivity (e.g., $1.59 \times 10^{-8}$ ohm-m) than other common metals such as copper (e.g., $1.67 \times 10^{-8}$ ohm-m) and aluminum (e.g., $2.82 \times 10^{-8}$ ohm-m) it costs orders of magnitude more than these other common metals. Therefore, one or more embodiments of the invention described herein are adapted to form a low cost and reliable interconnecting layer using an electrochemical plating process containing a common metal, such as copper. However, generally the electroplated portions of the interconnecting layer may contain a substantially pure metal or a metal alloy layer containing copper (Cu), silver (Ag), gold (Au), tin (Sn), cobalt (Co), nickel (Ni), zinc (Zn), lead (Pb), palladium (Pd), and/or aluminum (Al). Preferably, the electroplated portion of the interconnect layer contains substantially pure copper or a copper alloy.

Figure 2:
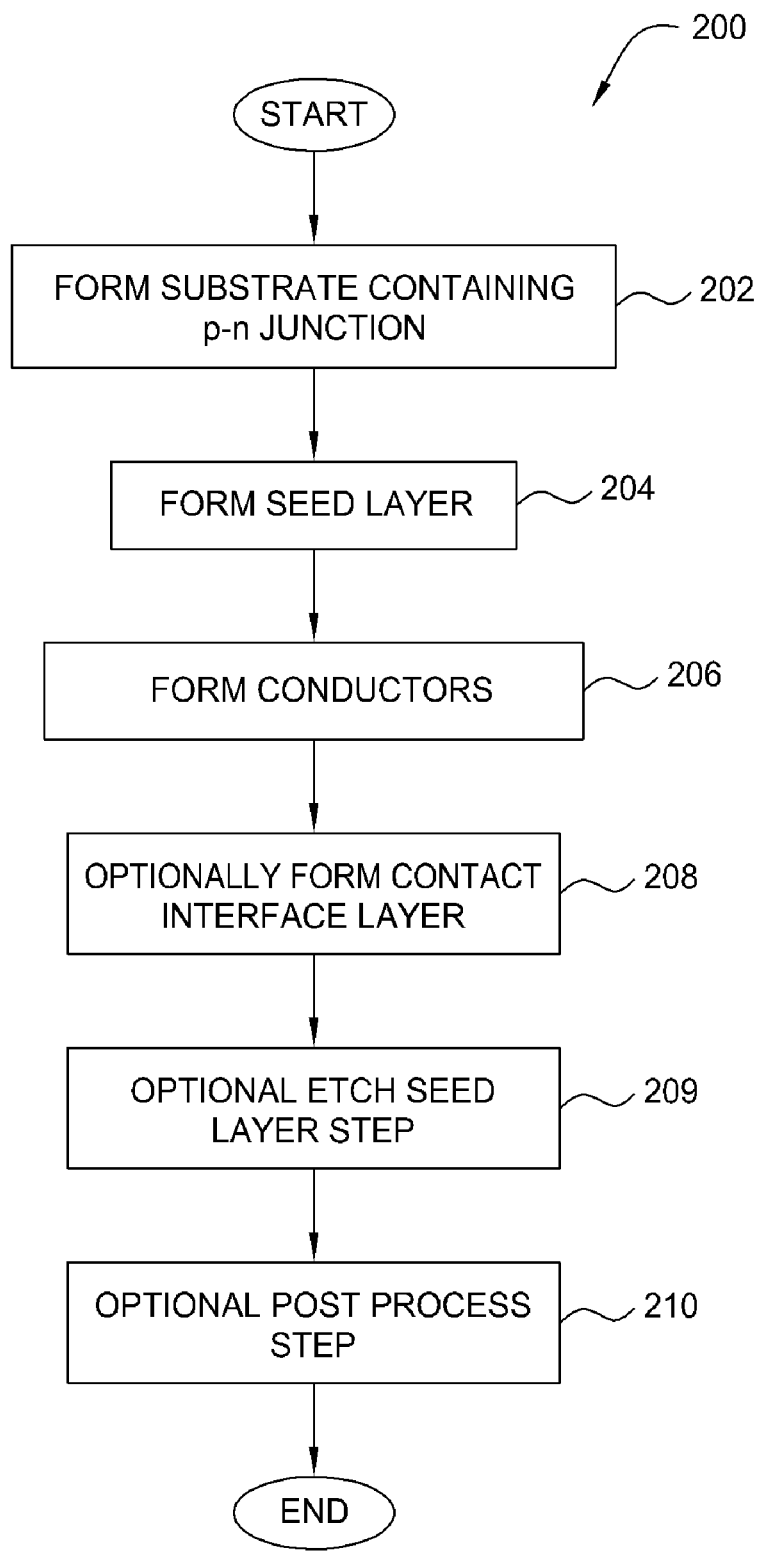
FIG. 2 illustrates a solar cell process sequence according to one embodiment described herein.

FIG. 2 illustrates a series of method steps 200 that are used to form metal contact structures on a solar cell device using the apparatus described herein. The processes described below may be used to form a solar cell having interconnects formed using any conventional device interconnection style or technique. Thus while the embodiments described herein are discussed in conjunction with the formation of a device that has the electrical contacts to the n-type and p-type junctions on opposing sides of the substrate this interconnect configuration is not intended to be limiting as to the scope of the invention, since other device configurations, such as PUM, multilayer buried contact structures, back-surface contacts (both electrical contacts on one side), may be formed using the apparatus and methods described herein without varying from the basic scope of the invention.

FIGS. 3A-3E illustrate the various states of a metallized substrate 320 after each step of method steps 200 has been performed. The method steps 200 start with step 202 in which a substrate 301 (FIG. 3A) is formed using conventional solar cell and/or semiconductor fabrication techniques. The substrate 301 may be formed from single crystal or polycrystalline silicon materials. Examples of these substrate fabrication process are the EFG process (Edge-defined Film-fed Growth) (e.g., U.S. Pat. No. 5,106,763), the RGS (Ribbon Growth on Substrate) process (e.g., U.S. Pat. No. 4,670,096, U.S. Pat. No. 5,298,109, DE 4,105,910 A1) and the SSP ribbon process (Silicon Sheets from Powder) (e.g., U.S. Pat. No. 5,336,335, U.S. Pat. No. 5,496,446, U.S. Pat. No. 6,111,191, and U.S. Pat. No. 6,207,891). In one example an n-type region 302 is disposed over the substrate 301 that has been doped with a p-type dopant. The n-type region 302 can be formed using conventional chemical vapor deposition (CVD) process, by driving-in an n-type dopant using a diffusion furnace, or other similar doping or film deposition techniques. The formed p-n junction will form a p-n junction region 303. An arc layer 311, or anti reflective coating, can be formed on the light-receiving surface 334 using a physical vapor deposition (PVD) or CVD technique. In one case, an aperture 312 is formed in the arc layer 311 so that a metal line can directly contact the n-type region 302. The apertures 312, as shown may formed in the arc layer 311 formed using a conventional lithography and wet or dry etching semiconductor processing techniques or by use of conventional laser drilling processes.

Figure 3A:
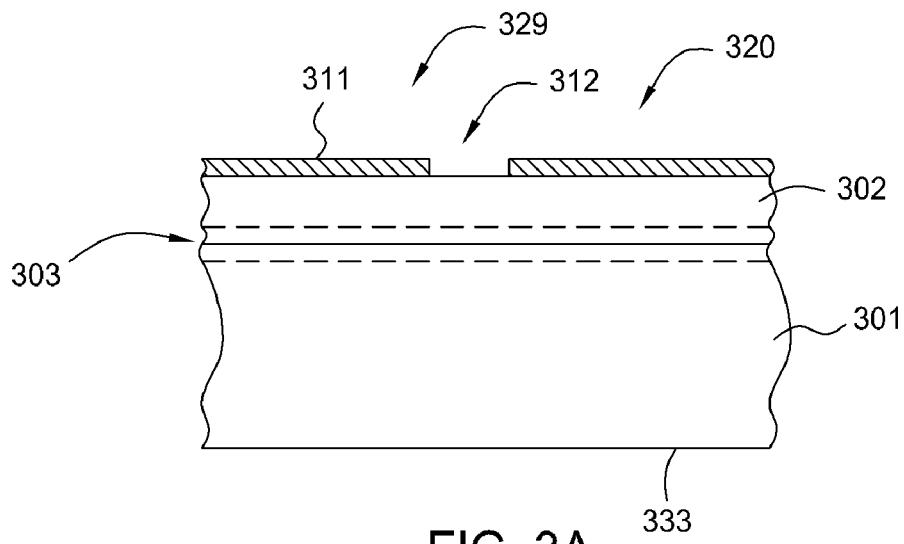
FIGS. 3A-3F illustrate schematic cross-sectional views of a solar cell during different stages of the process sequence described in FIG. 2.
Figure 3B:
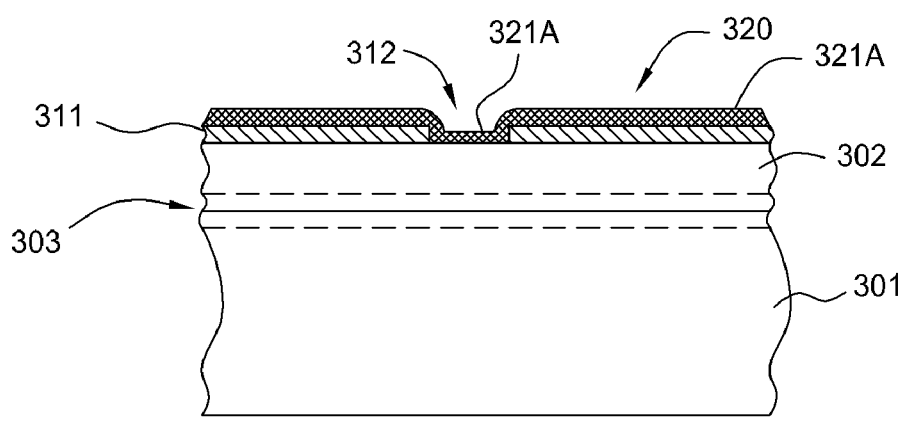
Figure 3C:
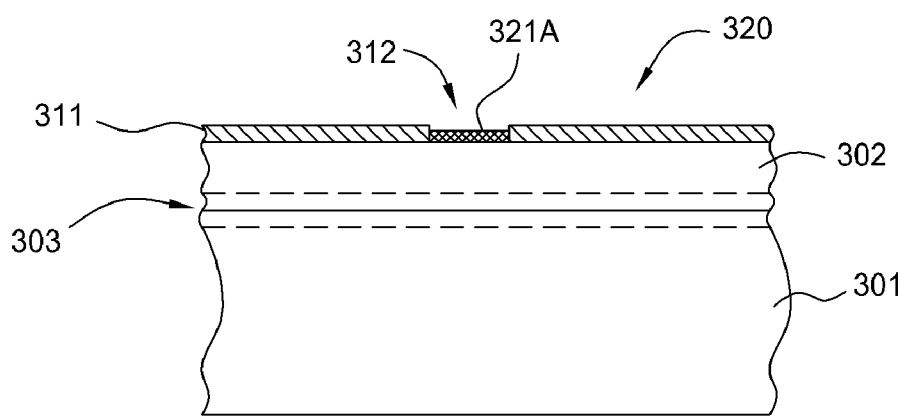

In the next step, step 204, as shown in FIG. 3C, a seed layer 321 is formed over desired regions of the substrate surface using a conventional selective deposition process, such as an electroless or selective CVD deposition process. An example of electroless deposition process that may be used to grow a seed layer 321 on a doped silicon region is further described in the U.S. patent application Ser. No. 11/385,047 [APPM 9916.02], filed Mar. 3, 2006, U.S. patent application Ser. No. 11/385,043 [APPM 9916.04], filed Mar. 20, 2006, and U.S. patent application Ser. No. 11/385,041 [APPM 10659], filed Mar. 20, 2006, which are all incorporated by reference in their entirety. In another embodiment, the seed layer 321 may be selectively formed by use of an inkjet, rubber stamping, or any technique for the pattern wise deposition (i.e., printing) of a metal containing liquid or colloidal media on the surface of the substrate. After depositing the metal containing liquid or colloidal media on the surface of the substrate it is generally desirable to subsequently perform a thermal post treatment to remove any solvent and promote adhesion of the metal to the substrate surface. An example of pattern wise deposition process that may be used to form a seed layer 321 on a region of a substrate is further described in the U.S. patent application Ser. No. 11/530,003 [APPM 10254], filed Sep. 07, 2006, which is incorporated by reference in its entirety.

In one embodiment, as shown in FIGS. 3B and 3C, the seed layer 321 is formed from a blanket seed layer 321A (FIG. 3B), that is deposited over the complete surface of the substrate and then selective regions are removed using conventional masking and etching techniques to form the seed layer 321 (FIG. 3C) that has a desired pattern on the surface of the substrate. In general, a blanket seed layer 321A may be deposited using a physical vapor deposition (PVD), chemical vapor deposition (CVD), molecular beam epitaxy (MBE), or atomic layer deposition (ALD) process.

In general, the seed layer 321 may contain a conductive material such as a pure metal, metal alloy or other conductive material. In one embodiment, the seed layer 321 contains one or more metals selected from the group consisting of nickel (Ni), cobalt (Co), titanium (Ti), tantalum (Ta), rhenium (Rh), molybdenum (Mo), tungsten (W), and ruthenium (Ru). It is desirable to select a deposition process and a metal that forms a good electrical contact, or ohmic contact, between the doped silicon region (e.g., n-type region 302) and the deposited seed layer 321. In one aspect, the seed layer 321 is selected so that it acts as a barrier to the diffusion of a metal in the subsequently formed conductor 325 during subsequent processing steps. For example, the seed layer 321 may contain one or more metals or metal alloys selected from the group consisting of nickel (Ni), cobalt (Co), titanium (Ti), their silicides, titanium tungsten (TiW), titanium nitride (TiN), tantalum (Ta), tantalum nitride (TaN), molybdenum (Mo), tungsten (W), tungsten silicide (WSi), molybdenum silicide (MoSi), and ruthenium (Ru). In one embodiment, the thickness of the seed layer 321 may be between about 0.1 micrometers (µm) and about 1 µm.

Figure 3D:
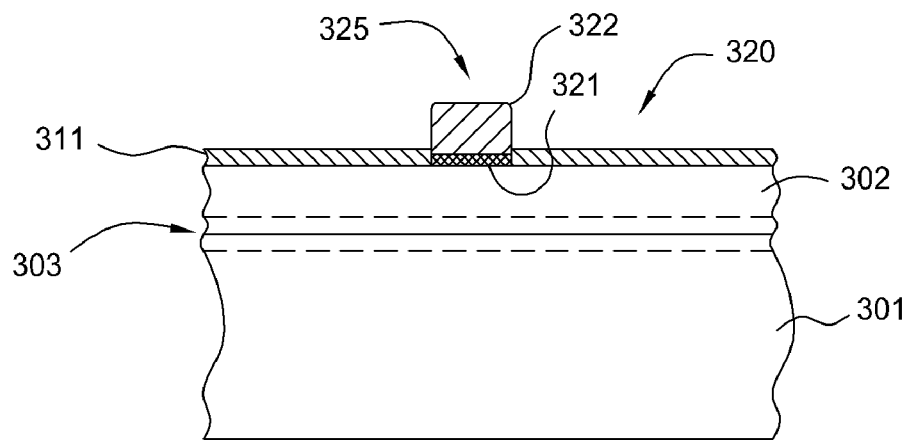

In one embodiment, the seed layer 321 consists of at least two layers of metal that are used to promote adhesion to the surface of the substrate, act as a diffusion barrier, and/or promote the growth of a subsequently deposited metal layer 322 contained within the conductor 325 (FIG. 3D). In one example, the seed layer 321 contains a first metal layer that is deposited on the substrate surface(s) and a second metal layer that contains copper. In this configuration the second layer is deposited over the first metal layer so that it can act as a seed on which an electrochemically deposited layer can be formed. In this case the first layer may contain one or more metals or metal alloys selected from the group consisting of nickel (Ni), cobalt (Co), titanium (Ti), titanium nitride (TiN), titanium tungsten (TiW), tantalum (Ta), tantalum nitride (TaN), molybdenum (Mo), tungsten (W), and ruthenium (Ru) that is deposited using an electroless deposition process, a conventional physical vapor deposition (PVD) process or a conventional chemical vapor deposition (CVD) process, and a second copper containing layer may be a substantially pure layer or an alloy that contains one or more metals selected from the group consisting of cobalt (Co), tin (Sn), silver (Ag), gold (Au), aluminum (Al), and nickel (Ni). In one embodiment, the second layer may be deposited using an electroless deposition process, a conventional physical vapor deposition (PVD) process or a conventional chemical vapor deposition (CVD) process.

Metal Fill/Metal Layer formation Process(es)

Figure 1A:
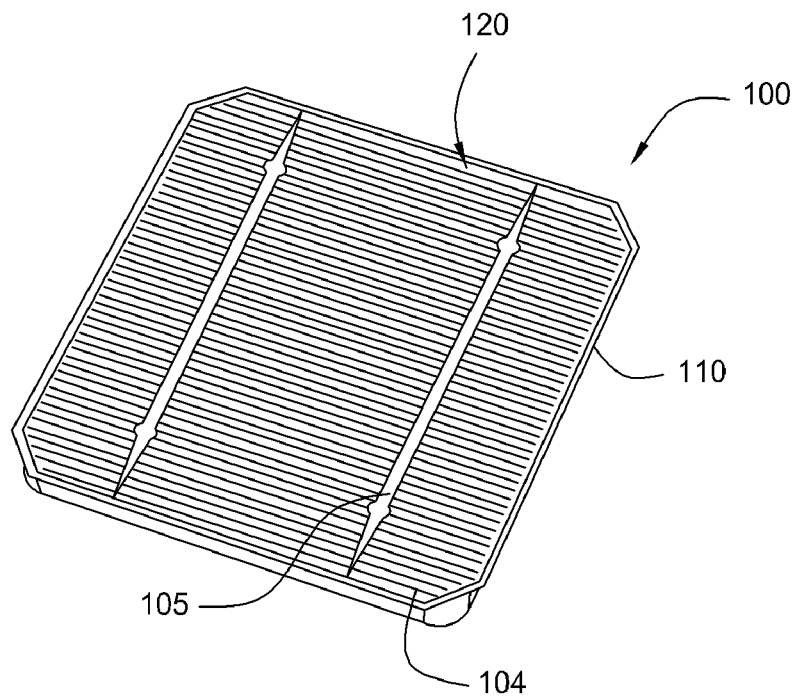
FIG. 1A illustrates an isometric view of prior art solar cell containing a front side metallization interconnect pattern.
Figure 1B:
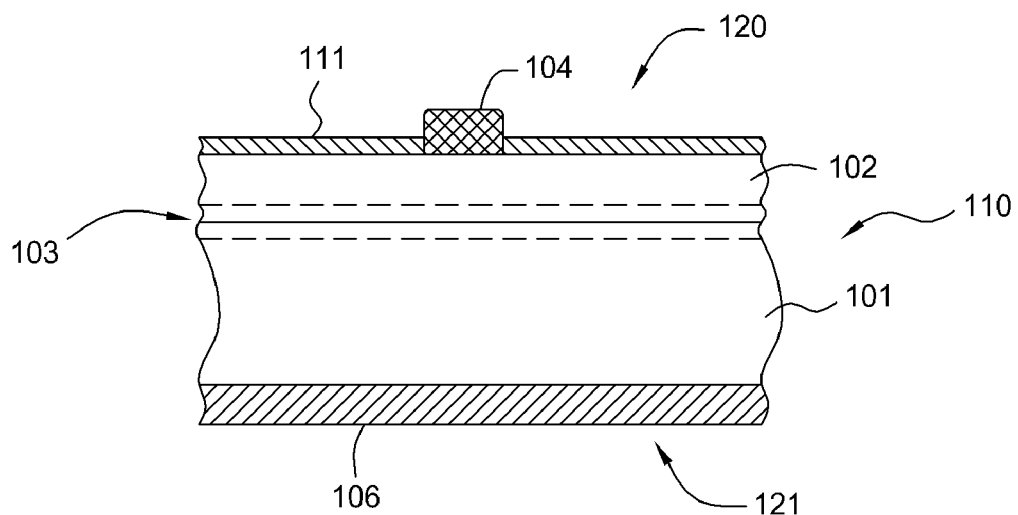
FIG. 1B illustrates a cross-sectional side view of a prior art solar cell shown in FIG. 1A.
Figure 1C:
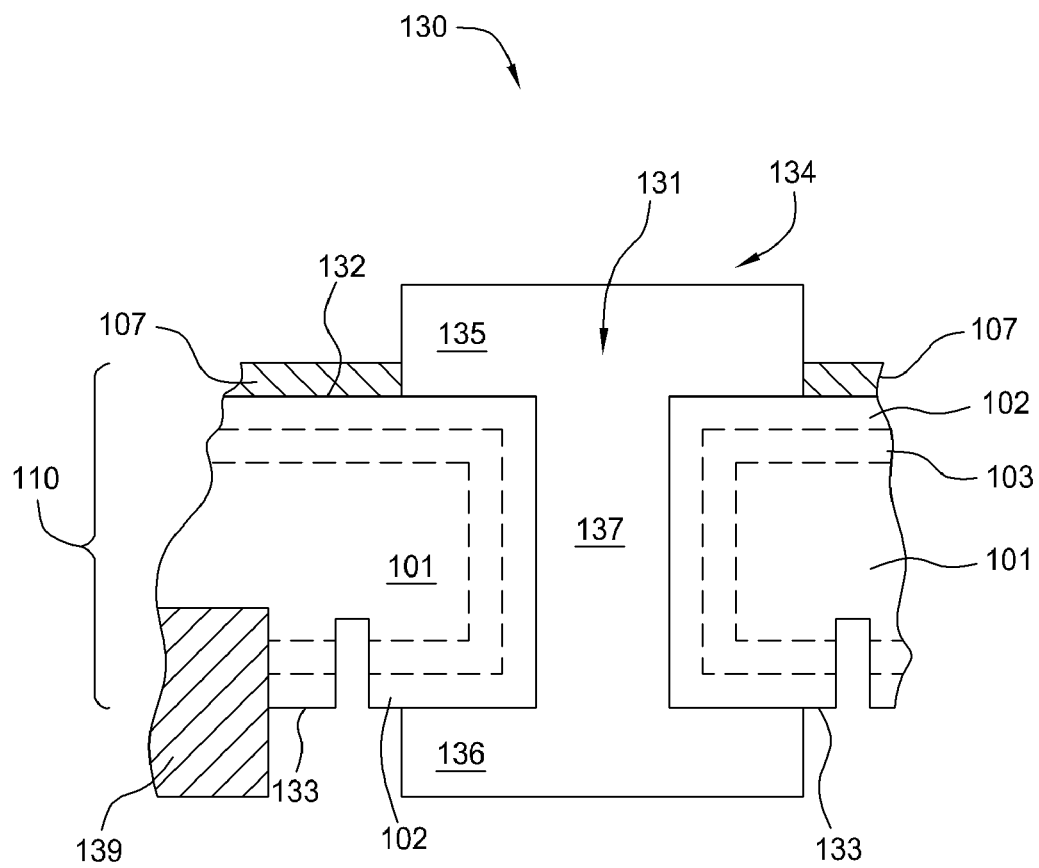
FIG. 1C illustrates a cross-sectional view of a prior art PUM type device.
Figure 1D:
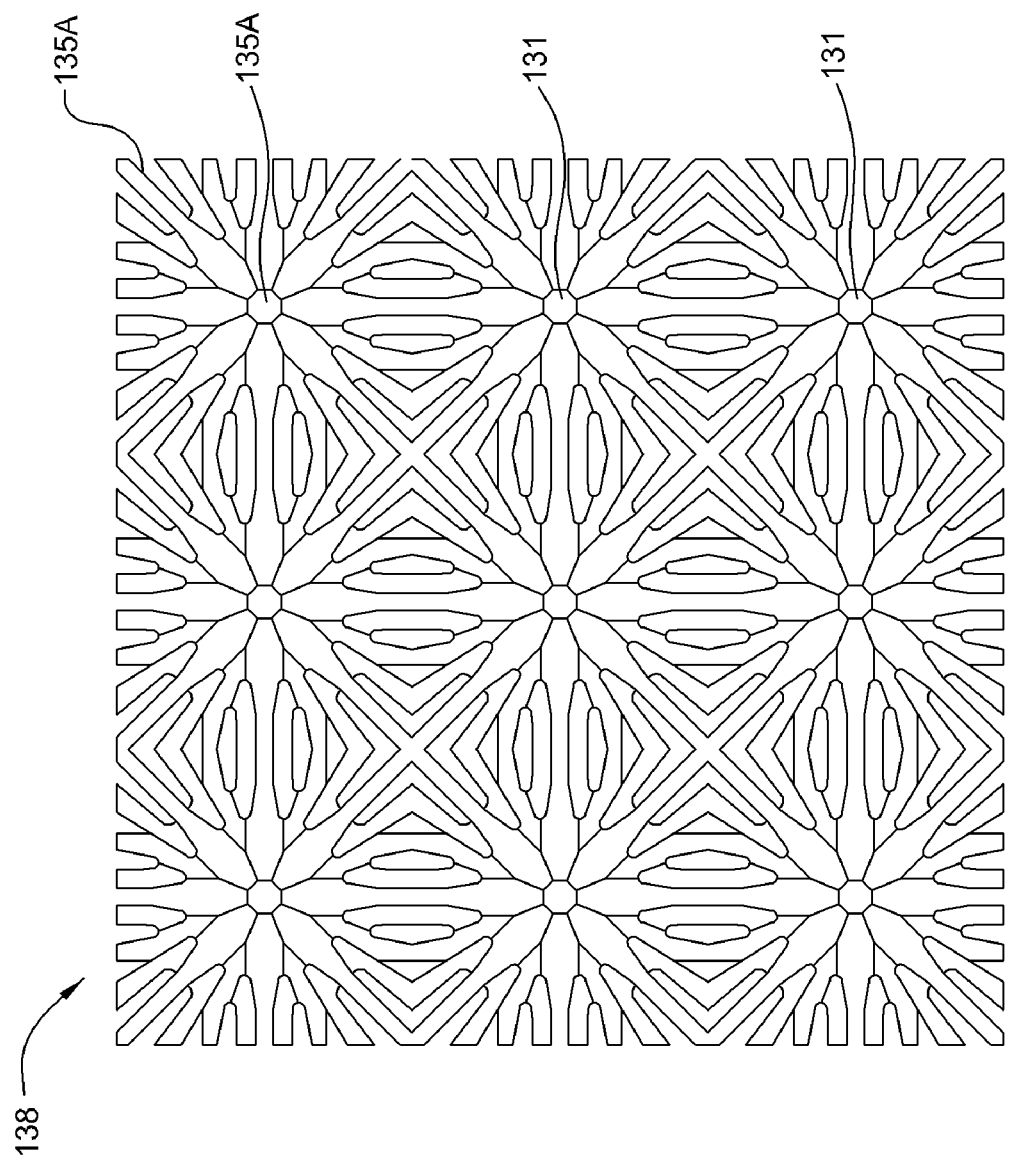
FIG. 1D illustrates a plan view of a top contact structure of a PUM cell, wherein the finger width and geometry have been optimized to maximize cell efficiency.
Figure 4A:
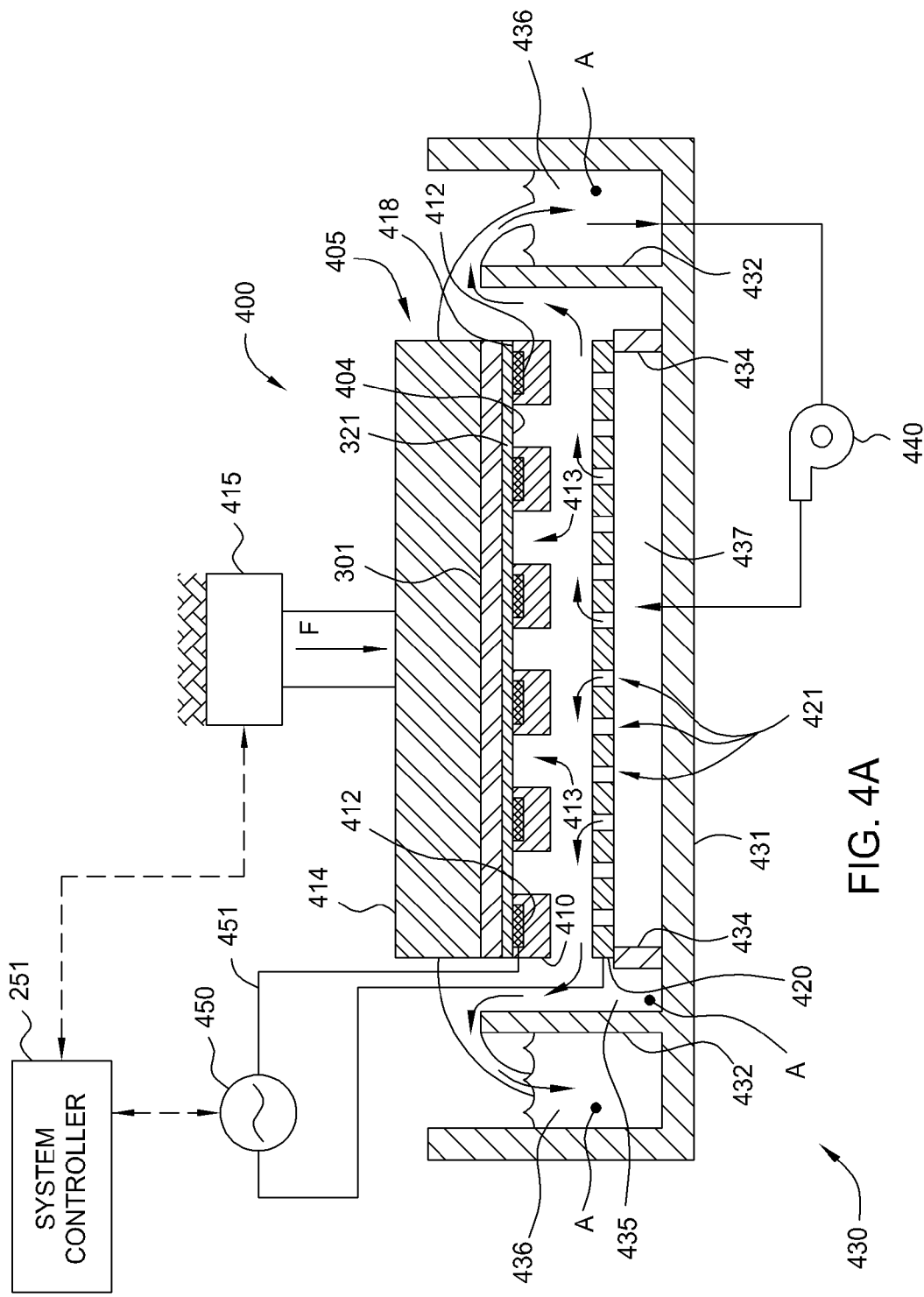
FIGS. 4A-4C illustrate a side cross-sectional view of an electrochemical processing chamber according to one embodiment described herein.

Referring to FIGS. 2, 3D and 4A, in step 206 the conductor 325 elements are electrochemically deposited selectively over desired regions of the seed layer 321 using a masking plate 410 that contains apertures 413 that preferentially allow the electrochemically deposited material to form therein. In this process step, the seed layer 321 is cathodically biased relative to an electrode 220 using a power supply 250, which causes the ions in an electrolyte to form a metal layer 322 on the exposed areas of the seed layer 321 created within the apertures 413. In one embodiment, the light-receiving side of the solar cell may have a metal pattern similar to the pattern shown in FIG. 1D, which is discussed above.

Figure 4B:
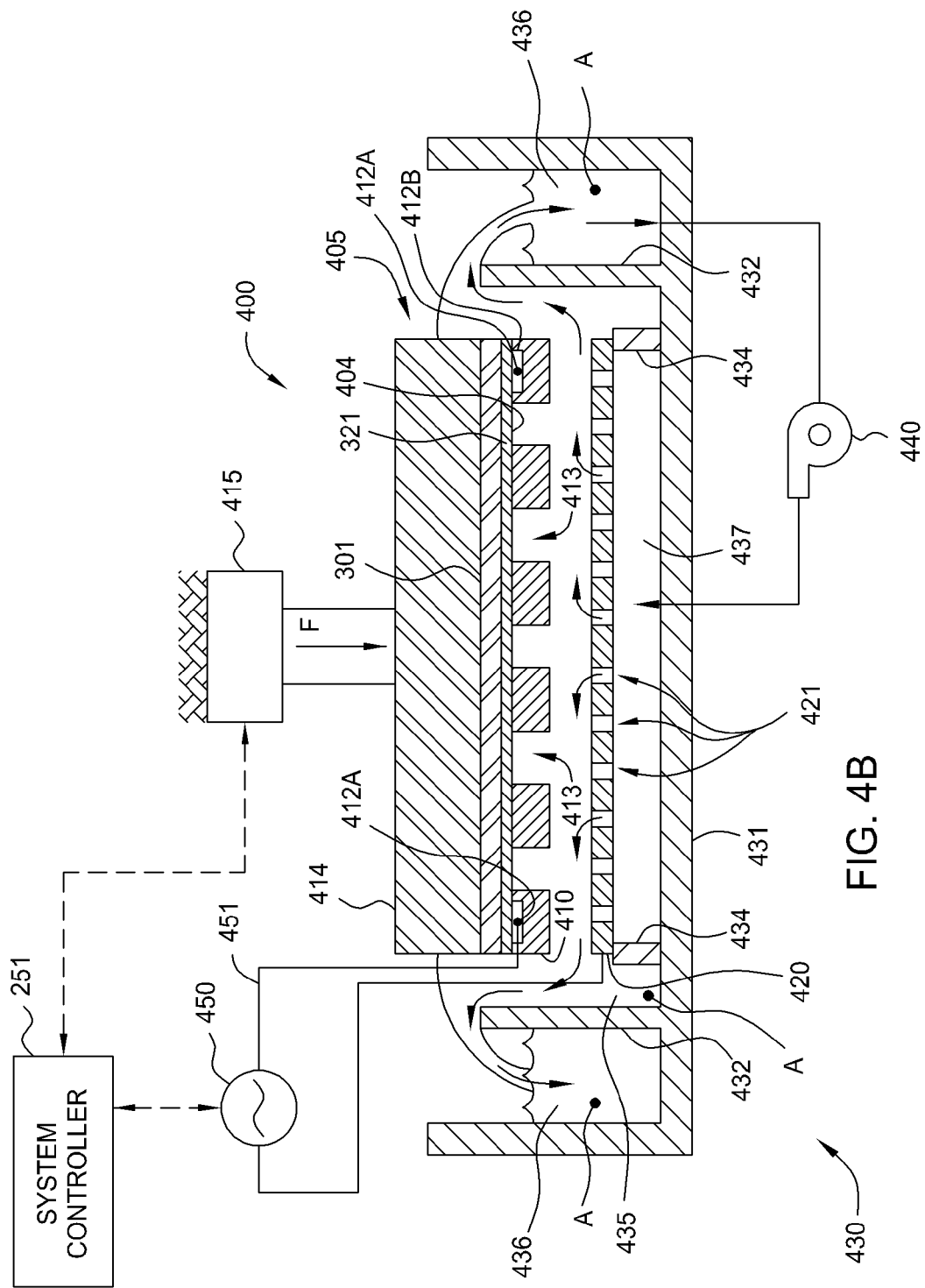
Figure 4C:
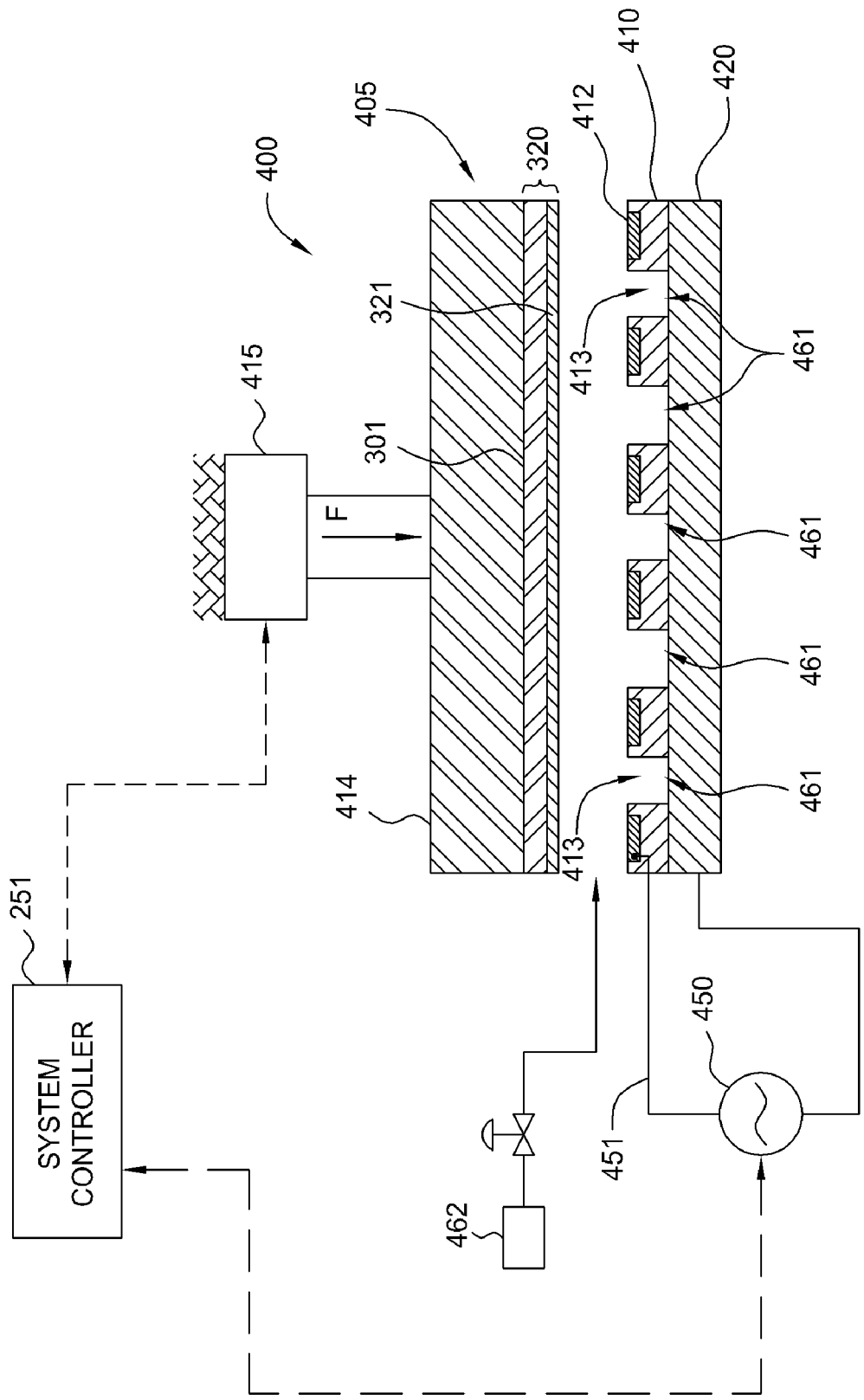

FIGS. 4A-4C are side cross-sectional views that illustrate various embodiments of an electrochemical plating cell 400 that may be used to electrochemically deposit a metal layer on the seed layer 321 of a metallized substrate 320 during step 206. While FIGS. 4A-4C illustrate the substrate in a face-down configuration (e.g., seed layer 321 is facing down) this configuration is not intended to be limiting as to the scope of the invention, since the electrochemical plating cell 400 can be in any desirable orientation, such as face-up or vertically oriented at some desirable angle. Generally, the electrochemical plating cell 400 generally contains a head assembly 405, an electrode 420, a power supply 450 and a plating cell 430. The head assembly 405 generally contains a thrust plate 414 and a masking plate 410 that is adapted to hold a metallized substrate 320 in a position relative to the electrode 420 during the electrochemical deposition. In one aspect, a mechanical actuator 415 is used to urge the thrust plate 414 and metallized substrate 320 against electrical contacts 412 so that an electrical connection can be formed between a seed layer 321 formed on the surface 403 of the metallized substrate 320 and the power supply 450 through the lead 451. In one embodiment, as shown in FIG. 4A, the electrical contacts 412 are formed on a surface of the masking plate 410. In another embodiment, as shown in FIG. 4B, the electrical contacts 412 may be formed from separate and discrete electrical contacts 412A that are nested within a recess 412B in the masking plate 410 when the metallized substrate is being urged against the masking plate 410. The electrical contacts (e.g., contacts 412, 412A) may be formed from a metal, such as platinum, gold, or nickel, or another conductive material, such as graphite, copper Cu, phosphorous doped copper (CuP), and platinum coated titanium (Pt/Ti).

Referring to FIGS. 4A-4B, in one aspect, it is desirable to rotate and/or move the metallized substrate 320 and head assembly 405 relative to the electrode 420 during processing by use of a rotary and/or linear motion actuator (not shown). In another embodiment, the plating system, chamber and plating cell may also utilize a conveyor type design that continuously plate a number of substrates at one time, for example, between 25 and 1000 substrates. The substrates in any of the processes described herein may be oriented in a horizontal, vertical or angled orientation relative to the horizontal during step 206.

The plating cell 430 generally contains a cell body 431 and an electrode 420. The cell body 431 will generally contain a plating region 435 and an electrolyte collection region 436 that contains an electrolyte (e.g., item "A") that is used to electrochemically deposit the metal layer on the substrate surface. In operation it is generally desirable to pump an electrolyte "A" from the electrolyte collection region 436 through a plenum 437 formed between the electrode 420 and the support features 434 past the apertures 413 formed in the masking plate 410 and then over a weir 432 separating the plating region 435 and to the electrolyte collection region 436, by use of a pump 440. In one aspect, the electrode 420 may be supported on one or more support features 434 formed in the cell body 431. In one embodiment, the electrode 420 contains a plurality of holes 421 that allow the electrolyte "A" passing from the plenum 437 to the plating region 435 to have a uniform flow distributed across masking plate 410 and contact at least one surface on the metallized substrate 320. The fluid motion created by the pump 440 allows the replenishment of the electrolyte components at the exposed region 404 that is exposed at one ends of the apertures 413. The electrode 420 may be formed from material that is consumable (e.g., copper) during the electroplating reaction, but is more preferably formed from a non-consumable material. A non-consumable electrode may be made of a conductive material that is not etched during the formation the metal layer 332, such as platinum or ruthenium coated titanium.

The masking plate 410 is generally made of a dielectric material that has a plurality of apertures 413 formed therein that allow the electrolyte "A" to contact exposed regions on the substrate surface (e.g., exposed regions 404). This configuration thus allows the preferential formation of an electrochemically deposited metal layer in the exposed regions 404 on the processing surface of the substrate when a cathodic bias of a sufficient magnitude is applied to the seed layer 321. In one embodiment, the masking plate 410 is made of glass, a plastic material, and/or a ceramic material that contains a plurality of apertures 413 that are formed in the masking plate 410 using conventional machining operations, such as laser cutting, milling, water-jet cutting, drilling, electro-discharge machining (EDM), or stamping processes. In one embodiment, the masking plate 410 may be formed from $SiO_2$, polyimide, quartz, or other ceramic, plastic, polymeric material or glass material, for example. In general, the masking plate 410 must be thicker than the maximum electrochemical deposition thickness to allow the masking plate to be separated from the substrate after the deposition process has been performed. Typically, the masking plate may be between about 100 µm and about 1 cm thick. In one embodiment, the surface of the masking plate 410 that is in contact with the processing surface of the substrate contains a compliant material that is adapted to compensate for surface topography on the substrate surface and/or more actively prevent plating of on these covered surfaces. Complaint materials may include polymeric materials (e.g., rubber materials) and polymeric materials that will not be chemically attacked by the electrolyte. The compliant materials may be soft enough to take-up variations in the topography of the substrate surface.

FIG. 4C illustrates a side cross-sectional view of another embodiment of the electrochemical plating cell 400 in which the masking plate 410 is connected to the electrode 420 so that a small electrolyte containing processing volumes 461 can be formed. The processing volumes 461 are formed when the metallized substrate 320 is brought into contact with the masking plate 410 and electrode 420, which thus forms multiple processing volumes 461 that are defined by each aperture 413, the seed layer 321 on the metallized substrate 320 surface, and the electrode 420. The electrolyte delivered to the processing volumes 461 may be delivered from an electrolyte source 462 that is positioned external to the electrochemical plating cell 400. The configuration illustrated in FIG. 4C is useful to reduce the amounts of the electrolyte contained within the electrochemical plating cell 400 during the electrochemical deposition step performed in step 206. It is generally advantageous to reduce the volume of electrolyte contained in the electrochemical plating cell 400 to reduce the volume and cost associated with discarding the waste electrolyte after one or more components break down in the solution (e.g., additives) after one or more deposition processes are performed using the electrolyte. It should be noted that FIG. 4C illustrates the electrochemical plating cell 400 in a "open" position in which the metallized substrate 320, which is retained on the thrust plate 414 of the head assembly 405 by conventional means (e.g., vacuum chuck or some other mechanical device), is spaced a distance away from the masking plate 410 and electrode 420 so that various processing activities could be performed, such as adding or removing the electrolyte from the multiple processing volumes 461.

Figure 4D:
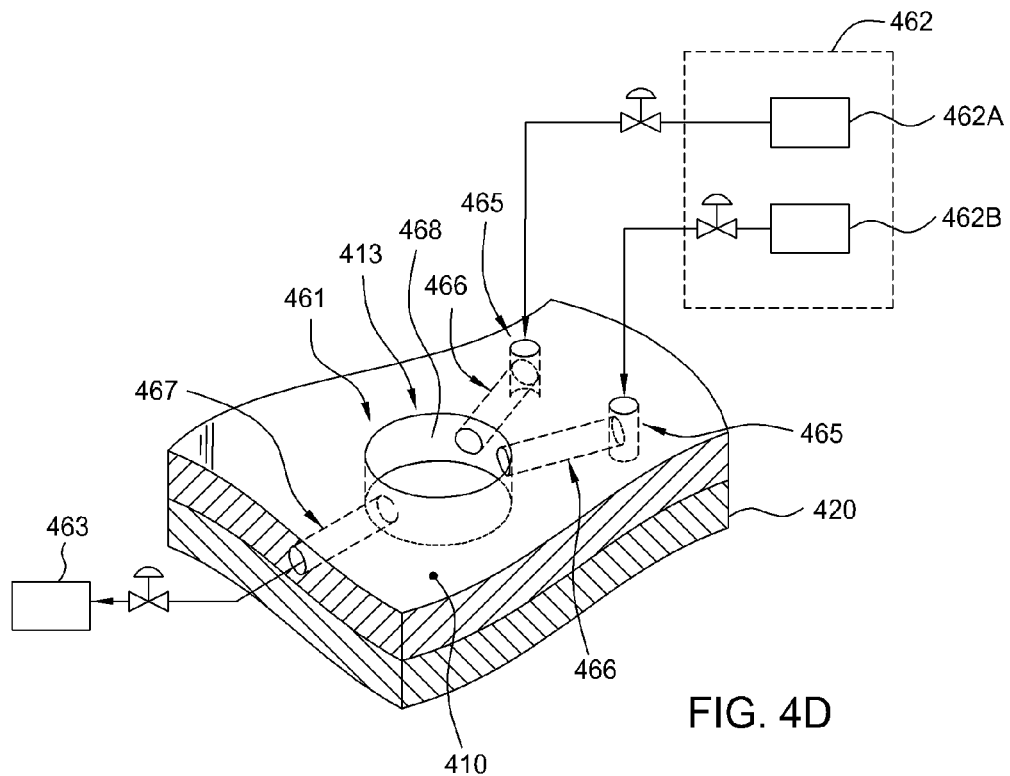
FIGS. 4D-4E illustrate a cross-sectional view of multiple elements found in the electrochemical processing chamber according to one embodiment described herein.
Figure 4E:
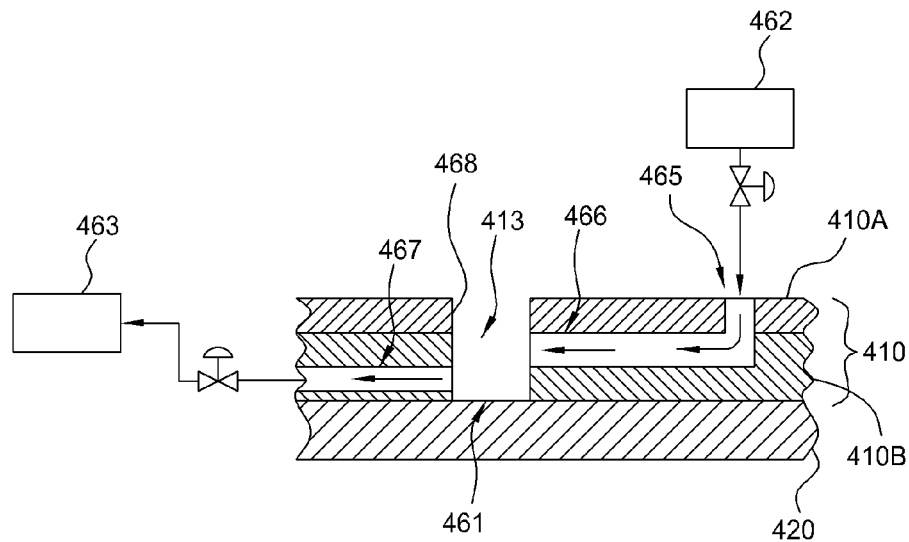

FIG. 4D is close-up an isometric view of one embodiment of a single aperture 413 formed in a masking plate 410. In one embodiment, the one or more input channels 466 and output channels 467 are formed in the in the masking plate 410 so that one or more electrolytes can be delivered from the electrolyte source 462 to the processing region 461 formed partially by the aperture 413 and electrode 420. In one aspect, as shown in FIGS. 4D-4E, the input channels 466 and output channel(s) 467 are formed in the sidewall 468 of the aperture 413. In one embodiment, as shown in FIG. 4D, a first electrolyte may be delivered to the aperture 413 from a first electrolyte source 462A through an inlet port 465 and input channel 466 formed in the masking plate 410. As shown in FIG. 4D, a second electrolyte may also be delivered to the aperture 413 from a second electrolyte source 462B through a separate inlet port 465 and input channel 466 formed in the masking plate 410. In one embodiment, a gas may be delivered from the one of the electrolyte sources 462 to push any electrolyte found in the input channel 466 and aperture 413 through the output channels 467 to a waste collection device 463. In one embodiment, it may be desirable to recirculate a volume of electrolyte through one or more apertures 413 using a pump (not shown) that is connected to an electrolyte source, an input channel 466, and an output channels 467.

FIG. 4E is a side cross-sectional view of one embodiment of the masking plate 410 design illustrated in the FIG. 4D that contains two or more bonded layers of material, such top layer 410A and bottom layer 410B, to cost effectively form the apertures 413, and channels (e.g., item #s 466, 467). In this configuration one or more features are formed in one or both of the bonded layers so that the inlet port 465, input channel 466, aperture 413 and output channel 467 can be formed by etching the various features into portions of the top layer 410A and bottom layer 410B. In one aspect, the top layer 410A and bottom layer 410B are formed from a glass material that contains features that formed by wet etching, laser ablation, or similar techniques.

Figure 5A:
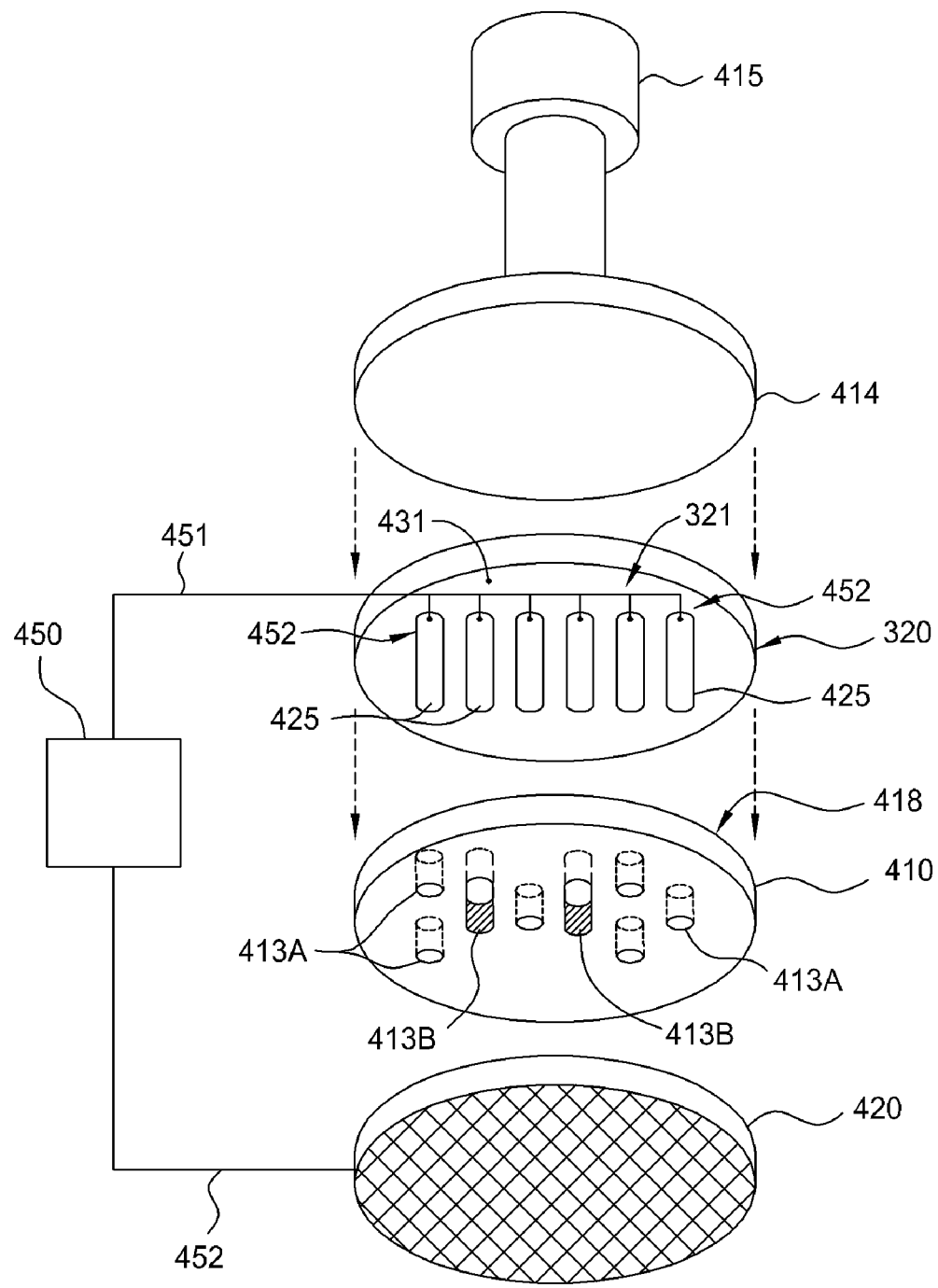
FIG. 5A illustrates is an isometric view of various electrochemical processing chamber components according to one embodiment described herein.

FIG. 5A illustrates an exploded isometric view of the head assembly 405, metallized substrate 320 and electrode 420 portion of the electrochemical plating cell 400. When in use the metallized substrate 320 is placed in contact with the masking plate 410 so that metal features 426 (FIG. 6A) can be formed on the exposed regions of the patterned features 425 of the seed layer 321 through the apertures (e.g., apertures 413A, 413B) formed in the masking plate 410. The patterned features 425 are metallized regions of the seed layer 321 that have been deposited or formed in a desired pattern on the surface 429 of the metallized substrate 320. It should be noted that the apertures 413 formed in the masking plate 410 may be formed in any desirable shape and/or pattern. In one embodiment, the apertures 413 formed in the masking plate 410 may be a rectangular or a circular feature that is between about 100 μm and about 240 μm in size. In another embodiment, the apertures formed in the masking plate 410 may be a rectangular features that are between about 100 μm and about 240 μm wide and have a length that extends across the substrate surface, such as between about 100 μm and about 30 cm in length. In one embodiment, the total exposed area on the surface of the substrate, which is the sum of all of the cross-sectional areas of all of the apertures 413 at the contacting surface 418 of the masking plate 410, is between about 0.5% and about 100% of the surface area of the surface of the substrate that is in contact with the masking plate 410. In one embodiment, the total exposed area of the apertures that are in contact with the non-light-receiving surface, or backside, of the substrate is greater than about 65% of the surface area of the non-light-receiving surface of the substrate. In one embodiment, the total exposed area of the apertures that are in contact with the light-receiving surface of the substrate is less than about 30% of the surface area of the light-receiving surface of the substrate. In one embodiment, the total exposed area of the apertures that are in contact with the light-receiving surface of the substrate is between about 0.1% and about 15% of the surface area of the light-receiving surface of the substrate.

Figure 5B:
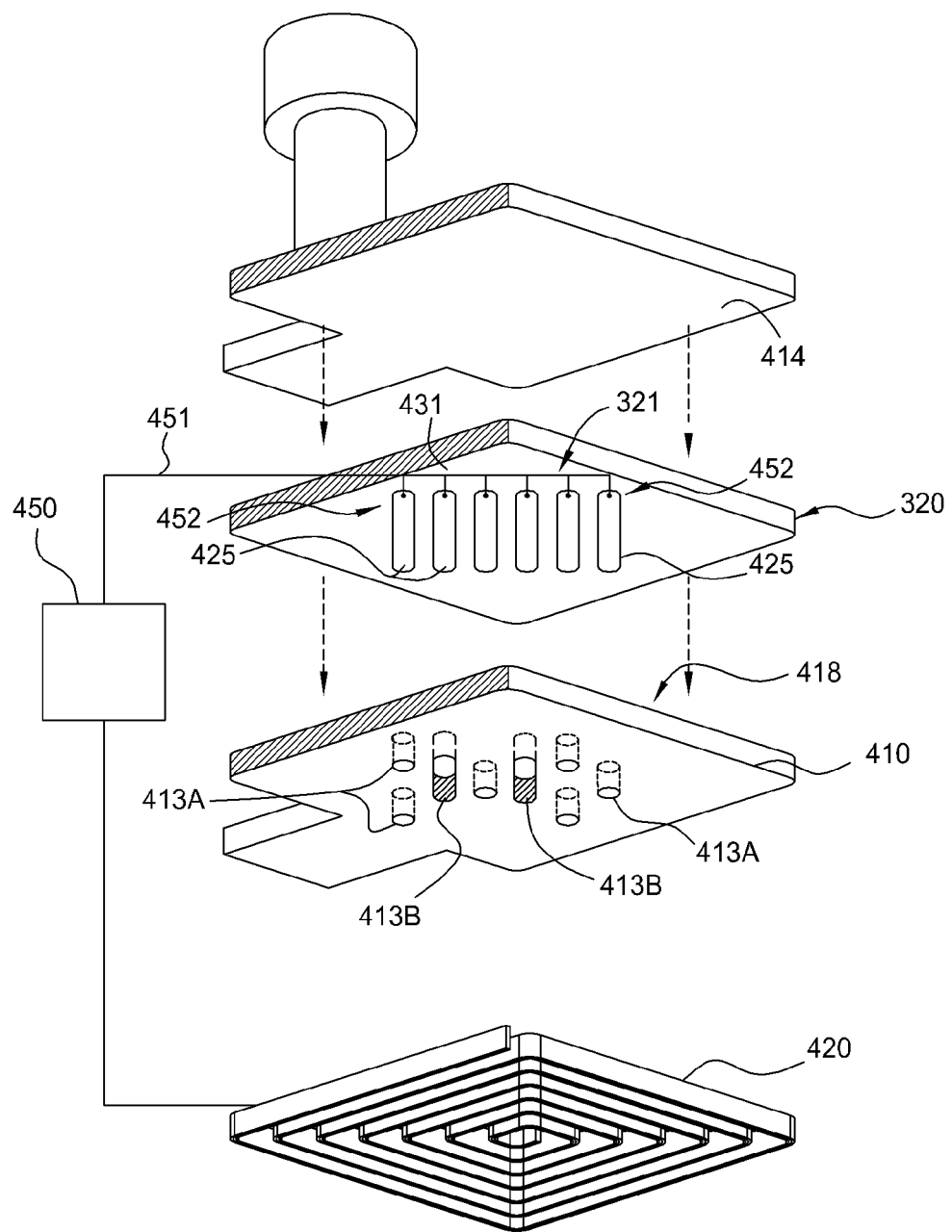
FIG. 5B illustrates is an isometric view of various electrochemical processing chamber components according to one embodiment described herein.

FIG. 5B is an exploded isometric view of the head assembly 405, metallized substrate 320, and electrode 420 portion of the electrochemical plating cell 400 according to another embodiment of the invention. FIG. 5B is similar to FIG. 5A except that the metallized substrate 320 and plating cell 430 components have a rectangular shape. The adjustments to the shape of the head assembly 405 components and electrode 420 may be useful where the metallized substrate 320 has a rectangular shape.

Figure 6A:
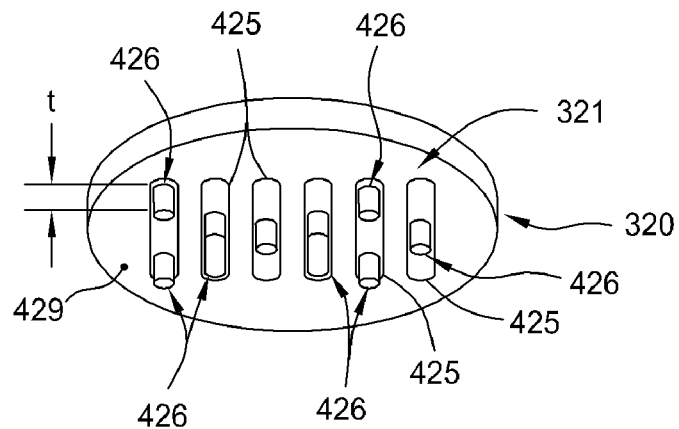
FIGS. 6A-6F illustrate an isometric view of a substrate having an electrochemically deposited layer formed thereon according to one embodiment described herein.
Figure 6B:
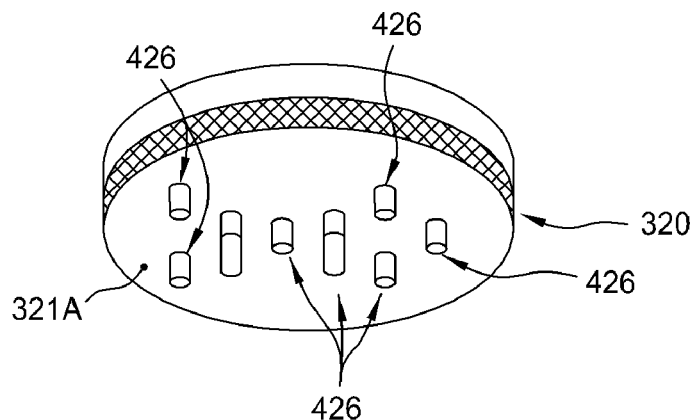
Figure 6C:
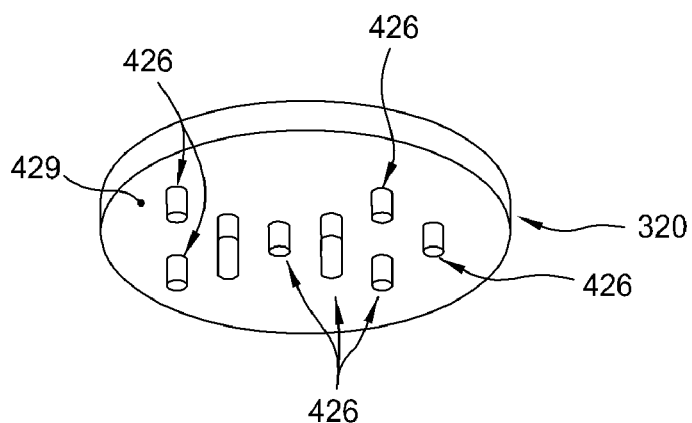
Figure 6D:
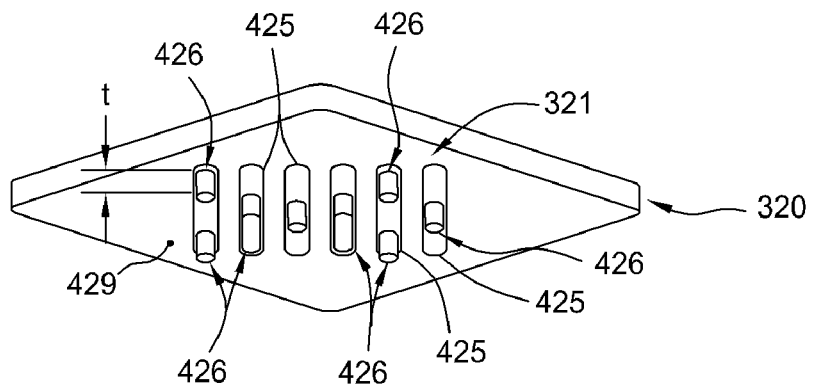

FIGS. 6A and 6D are isometric views of circular and square metallized substrates 320 that contains a plurality of metal features 426 formed on certain regions of the patterned features 425 after step 206 of the method steps 200 has been performed. Referring to FIGS. 5A and 6A, in one example a group of circular apertures 413A and slot shaped apertures 413B formed in the masking plate 410 are aligned to the patterned features 425 of the seed layer 321 so that metal features 426 having a desirable shape and thickness "t" (FIGS. 6A and 6D) can be preferentially formed thereon. The metal features 426 are formed by cathodically biasing the patterned features 425 using the power supply 450 and the contact(s) 452 so that the metal layer 322 can be grown to a desired thickness. Typically, the thickness "t" of the metal features 426 that form the conductor 325 are between about 10 μm and about 40 μm thick, which is hard to accomplish using conventional electroless, PVD and CVD techniques at an acceptable substrate throughput and/or desirable deposition thickness uniformity.

Figure 6E:
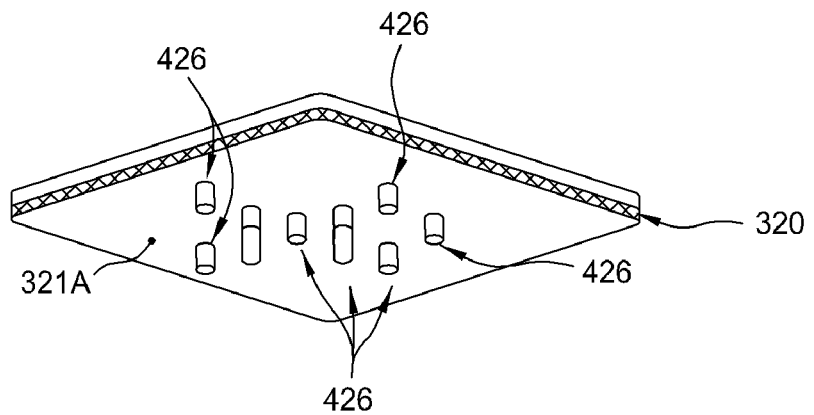
Figure 6F:
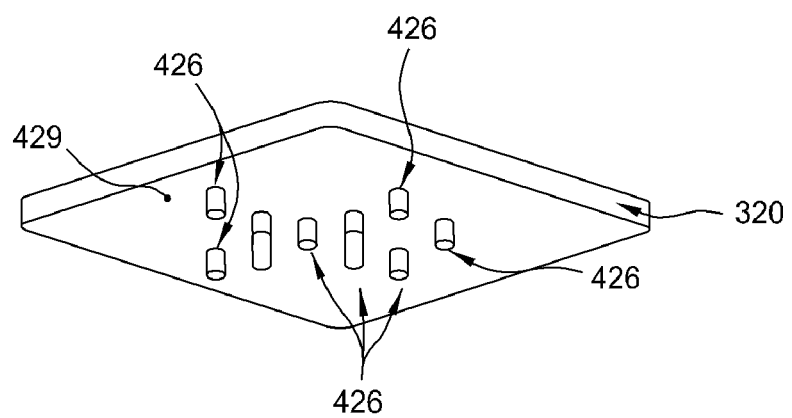

FIGS. 6B and 6E are isometric views of circular and square metallized substrates 320 that contains a plurality of metal features 426 formed on a blanket seed layer 321A formed after performing step 206 of the method steps 200. In this case, a group of metal features 426 formed on selected areas of the blanket seed layer 321A that have a shape defined by the apertures (e.g., apertures 413A, 413B) and a thickness "t" (FIG. 6B or 6E) set by the deposition rate and deposition time of electrochemical deposition process performed in step 206. The metal features 426 may be formed on desirable regions of the blanket seed layer 321A by aligning the masking plate 410 to the metallized substrate 320.

FIGS. 6C and 6E are isometric views of circular and square metallized substrates 320 that contains only the plurality of metal features 426 formed on the surface 429 of the metallized substrate 320 after an optional metal layer removal step is performed. The optional metal layer removal step generally entails performing a conventional wet or dry etching step to remove any unwanted and/or excess metal on the surface 429 of the substrate, such as unused portions of the blanket seed layer 321A (FIG. 6B or 6E) or unused portions of the patterned features 425 (FIG. 6A or 6C).

The system controller 251 is adapted to control the various components used to complete the electrochemical process performed in the electrochemical plating cell 400. The system controller 251 is generally designed to facilitate the control and automation of the overall process chamber and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the electrochemical plating cell processes (e.g., electrolyte temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 251 determines which tasks are performable on a substrate. Preferably, the program is software readable by the system controller 251 that includes code to perform tasks relating to monitoring and execution of the electrochemical process recipe tasks and various chamber process recipe steps.

In one embodiment of step 206, one or more direct current (DC) and/or pulse plating waveforms are delivered to the seed layer 321 during the electrochemical deposition process to form the metal layer 322 that has desirable electrical and mechanical properties. The applied bias may have a waveform that is DC and/or a series of pulses that may have a varying height, shape and duration to form the conductor 325. In one embodiment, a first waveform is applied to the seed layer 321 by use of a power supply 250 to cause some electrochemical activity at the surface of the seed layer. In this case, while the bias applied to the seed layer need not always be cathodic, the time average of the energy delivered by the application of the first waveform is cathodic and thus will deposit a metal on the surface of the seed layer 321. In another embodiment, it may be desirable to have a time average that is anodic (i.e., dissolution of material) to clean the surface of the seed layer prior to performing the subsequent filling process steps. The concentration gradients of metal ions, additives or suppressors in the electrolyte "A" (FIGS. 4A-4B) in the proximity of the conductor 325 are affected by the polarity, sequencing, and durations of bias delivered to the surface of the substrate. For example, it is believed that the duration of a deposition pulse during a pulse plating type process controls the deposition on the sidewall of the feature, while the dissolution pulse creates additional metal ions and thus, a concentration gradient of these ions, around the feature. By dissolving some deposited metal from the top of the feature, an electrodissolution pulse (or reverse pulse) allows sufficient time for bottom-up growth within the high aspect ratio feature, without void or seam formation.

Figure 7:
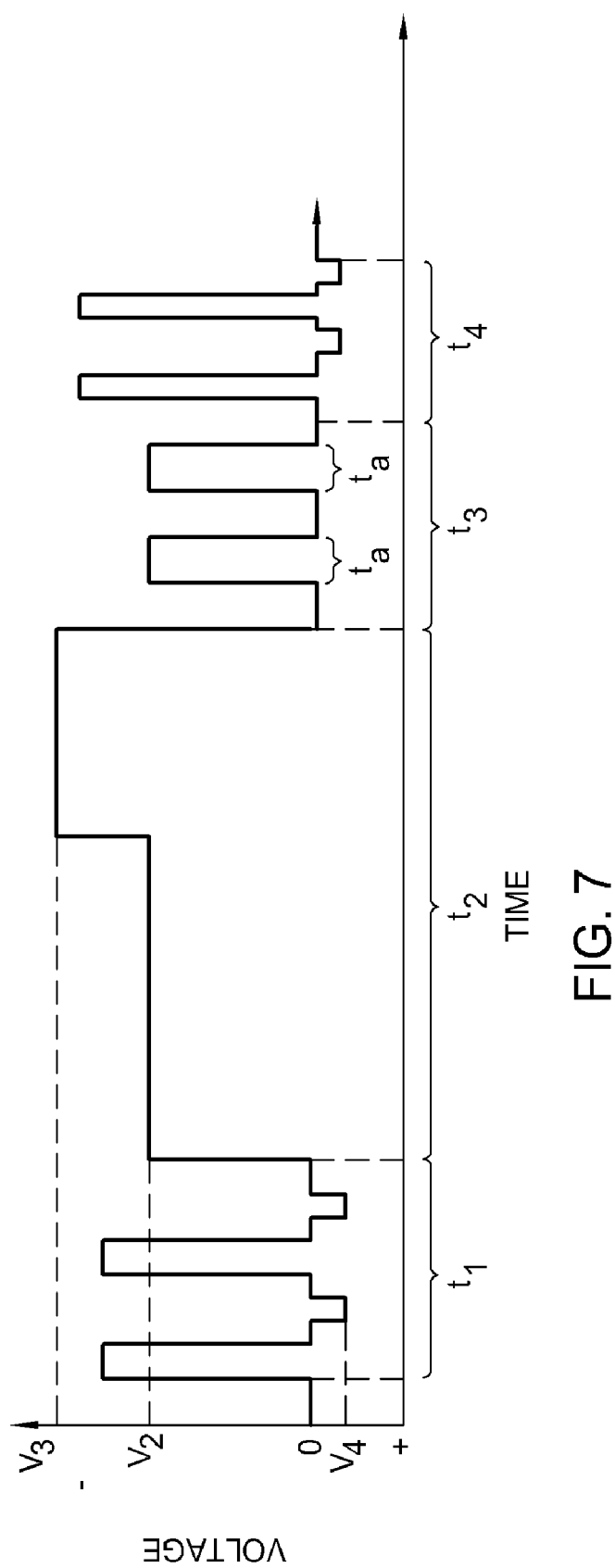
FIG. 7 illustrates a waveform that can be used to electrochemically plated a metal layer on a surface of a substrate according to one embodiment described herein.

In one example, as shown in FIG. 7, in step 206 a series of different waveforms are applied to the seed layer 321 and electrode 420 (FIGS. 4A-4B) by the power supply 450 to form the conductor 325. Referring to FIG. 7, a first waveform having both cathodic and anodic pulses of a desired magnitude (e.g., $V_1$ and $V_4$, respectively) and duration are delivered to the seed layer 321 for a period of time $t_1$. Next, a second DC type waveform having a magnitude $V_2$ and $V_3$ are delivered during a period of time $t_2$ and then a third pulse type waveform having an increasing magnitude (e.g., between $V_2$ and $V_3$,) is delivered to the seed layer 321 during the period of time $t_3$. Finally, a fourth waveform having both cathodic and anodic pulses of a desired magnitude (e.g., $V_1$ and $V_4$, respectively) and duration are delivered to the seed layer 321 during a period of time $t_4$. It should be noted that the shape of the pulses, the relative magnitudes of the pulses within each waveform, the number pulse per waveform, and/or the duration of each pulse or waveform illustrated in this example are not intended to be limiting as to the scope of the invention described herein.

It is believed that by controlling the magnitude, duration and polarity of successive pulses the grain size of the metal layer formed using an electrochemical deposition process can be controlled. It is generally well known that by using pulse plating waveform that has many rapid pulses that have a high magnitude or a number of pulses having alternating polarity will generate a layer that has a lower stress and generally a smaller grain size than an electrochemically deposited layer that is formed using a DC waveform or pulse type waveform that are of a longer duration and/or have a smaller pulse magnitude. Therefore, by controlling the waveform, deposition rate, and chemistry used to form the metal layer 322 having a varying grain size a low stress metal layer can be formed that is able to form a reliable low stress conductors 325 on the surface of the substrate.

Electrolyte Solution

In general, it is desirable to form a conductor 325 that is defect free, has a low stress that can fill any deep features formed on the substrate surface from the bottom-up. The electrochemical process performed in the electrochemical plating cell 400 utilizes an electrolyte solution containing a metal ion source and an acid solution. In some cases one or more additives, such as an accelerator, a suppressor, a leveler, a surfactant, a brightener, or combinations thereof may be added to the electrolyte solution to help control the grain size and uniformity of the electrochemically deposited metal layer(s). However, additives generally make the control of the electrochemical process more complex and make the cost of the consumables generated during the electrochemical plating process to increase, since they are generally consumed or breakdown during the electrochemical process. In one embodiment, to increase the planarization power, the electrolyte can optionally contain an inorganic acid, (e.g., sulfuric acid, phosphoric acid or pyrophosphoric acid), various inorganic supporting salts, and other additives that may be used to improve the quality of plated surfaces (e.g., oxidizers, surfactants, brighteners, etc.).

In general, the electrolyte and components in the system are selected so that they are chemically compatible with each other. In one embodiment, the masking plate 410 is formed from a material that will not be attacked by one or more of the components in the electrolyte solution. Since high speed electrochemical plating processes typically use electrolytes that may have a pH within a range between about 0.5 and about 12 the masking plate 410 and other chamber components need to be compatible with these electrolyte chemistries. In some aspects of the invention, due to cost and electrochemical plating performance reasons it may be desirable to use an electrolyte that contains potassium hydroxide (KOH), sodium hydroxide (NaOH), tetramethylammonium hydroxide (TMAH), or other similar components, which are generally not compatible with most organic (e.g., photoresist) or wax like materials. In one aspect, the pH of such solutions is between about 7 and about 12. Therefore, as noted above the masking plate may be formed from materials, such as a ceramic, a plastic, a polymeric material or a glass material that are compatible with these chemistries.

In one example, the metal ion source within the electrolyte solution used in step 206 in FIG. 2 is a copper ion source. In one embodiment, the concentration of copper ions in the electrolyte may range from about 0.1 M to about 1.1M, preferably from about 0.4 M to about 0.9 M. Useful copper sources include copper sulfate ($CuSO_4$), copper chloride ($CuCl_2$), copper acetate ($Cu(CO_2CH_3)_2$), copper pyrophosphate ($Cu_2P_2O_7$), copper fluoroborate ($Cu(BF_4)_2$), derivatives thereof, hydrates thereof or combinations thereof. The electrolyte composition can also be based on the alkaline copper plating baths (e.g., cyanide, glycerin, ammonia, etc) as well.

In one example, the electrolyte is an aqueous solution that contains between about 200 and 250 g/l of copper sulfate pentahydrate ($CuSO_4.5(H_2O)$), between about 40 and about 70 g/l of sulfuric acid ($H_2SO_4$), and about 0.04 g/l of hydrochloric acid (HCl). In some cases it is desirable to add a low cost pH adjusting agent, such as potassium hydroxide (KOH) or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In another example, the electrolyte is an aqueous solution that contains between about 220 and 250 g/l of copper fluoroborate ($Cu(BF_4)_2$), between about 1.5 and about 15 g/l of tetrafluoroboric acid ($HBF_4$), and about 1.5 and about 16 g/l of boric acid ($H_3BO_3$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In yet another example, the electrolyte is an aqueous solution that contains between about 60 and about 90 g/l of copper sulfate pentahydrate ($CuSO_4.5(H_2O)$), between about 300 and about 330 g/l of potassium pyrophosphate ($K_4P_2O_7$), and about 10 to about 35 g/l of 5-sulfosalicylic acid dehydrate sodium salt ($C_7H_5O_6SNa.2H_2O$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In yet another example, the electrolyte is an aqueous solution that contains between about 30 and about 50 g/l of copper sulfate pentahydrate ($CuSO_4.5(H_2O)$), and between about 120 and about 180 g/l of sodium pyrophosphate decahydrate ($Na_4P_2O_7.10(H_2O)$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In one embodiment, it may be desirable to add a second metal ion to the primary metal ion containing electrolyte bath (e.g., copper ion containing bath) that will plate out or be incorporated in the growing electrochemically deposited layer or on the grain boundaries of the electrochemically deposited layer. The formation of a metal layer that contains a percentage of a second element can be useful to reduce the intrinsic stress of the formed layer and/or improve its electrical and electromigration properties. In one example, it is desirable to add an amount of a silver (Ag), nickel (Ni), zinc (Zn), or tin (Sn) metal ion source to a copper plating bath to form a copper alloy that has between about 1% and about 4% of the second metal in the deposited layer.

In one example, the metal ion source within the electrolyte solution used in step 206 in FIG. 2 is a silver, tin, zinc or nickel ion source. In one embodiment, the concentration of silver, tin, zinc or nickel ions in the electrolyte may range from about 0.1 M to about 0.4M. Useful nickel sources include nickel sulfate, nickel chloride, nickel acetate, nickel phosphate, derivatives thereof, hydrates thereof or combinations thereof.

In one embodiment, it may be desirable to add one or more organic additives to the electrolyte bath to enhance the deposition process. Typical suppressing type additives may include polyethyleneglycole (PEG), and typical accelerating additives may include bis(sodiumsulfopropyl)disulfide (SPS), bis 3-sulfopropyl disulfide, mercaptopropane sulfonic acid, and 3-mercapto-1-propanesulfonate.

Contact Interface Layer

Figure 3E:
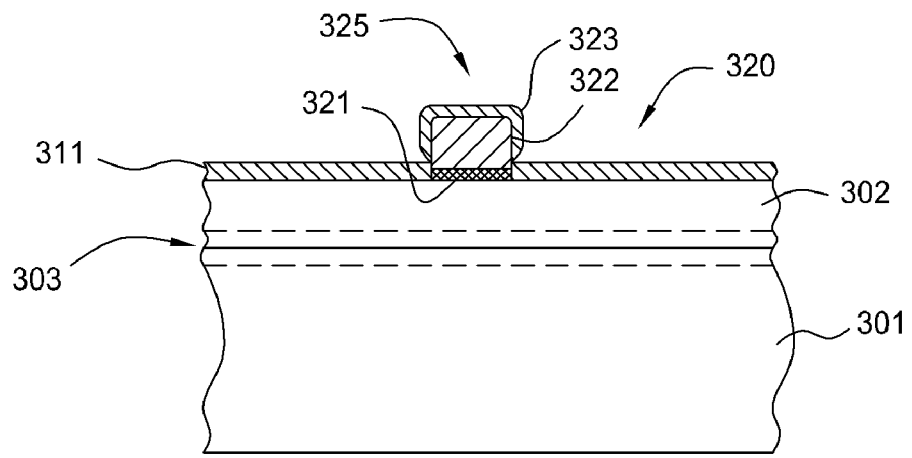
Figure 3F:
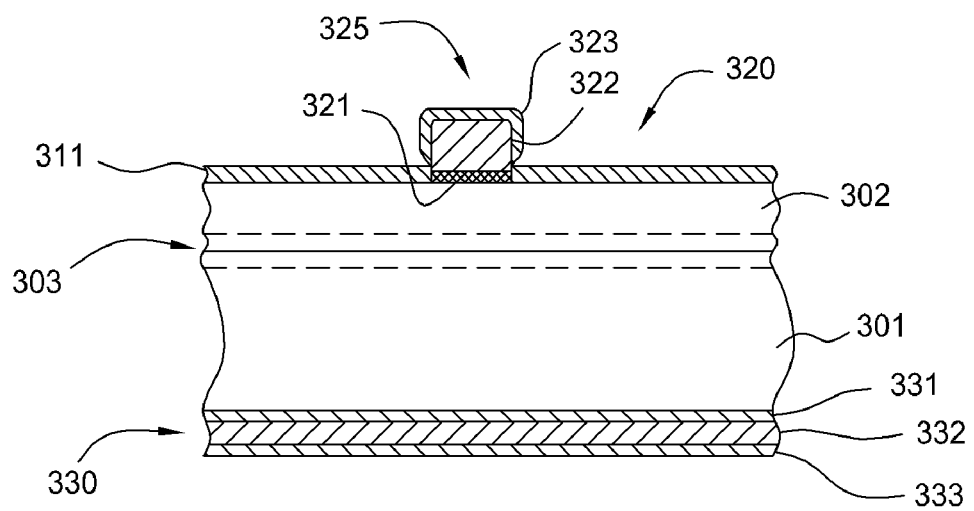

Referring to FIGS. 2 and 3E, in step 208 an optional contact interface layer 323 is deposited over the surface of the metal layer 322 formed during step 206. The contact interface layer 323 can be formed using an electrochemical deposition process, an electroless deposition process, a CVD deposition process, or other comparable deposition processes to form a good ohmic contact between the formed conductors 325 and an external interconnection bus (not shown) that is adapted to connect one or more solar cells together. In one embodiment, the contact interface layer 323 is formed from a metal that is different from the metal contained in the metal layer 322. In this configuration the contact interface layer 323 may be formed from a pure metal or metal alloy that contains metals, such as tin (Sn), silver (Ag), gold (Au), lead (Pb), or ruthenium (Ru). In one embodiment, the thickness of the contact interface layer 323 may be between about 3 μm and about 7 μm. Forming a contact interface layer 323 having a thickness greater than 3 μm is generally hard to accomplish using conventional electroless, PVD and CVD techniques at an acceptable substrate throughput and/or desirable deposition thickness uniformity.

In one embodiment, the contact interface layer 323 is formed by use of an electrochemical process. In some cases it is desirable to perform step 208 in the same electrochemical plating cell as step 206 was performed. In this configuration, the seed layer 321 and metal layer 322 are cathodically biased relative to an electrode (e.g., electrode 420 in FIG. 4A or 4B) using a power supply that causes the ions in an contact interface layer electrolyte, which is brought into contact with the seed layer 321, metal layer 322 and the electrode, to plate the contact interface layer 323 on the surface of the seed layer 321 and/or metal layer 322. In the case where the contact interface layer 323 is formed in the same electrochemical plating cell 400 as the metal layer 322 and the contact interface layer 323 contains one or more different elements than the metal layer 322 the electrolyte used to form the metal layer will need to be discarded and replaced with the new contact interface layer electrolyte to form the contact interface layer 323.

Contact Interface Layer Electrolyte Solution

In one embodiment, the contact interface layer 323 contains tin (Sn) and is deposited by use of an electrochemical deposition process. The concentration of tin ions in the contact interface layer electrolyte may range from about 0.1 M to about 1.1M. Useful tin sources include tin sulfate ($SnSO_4$), tin chloride ($SnCl_2$), and tin fluoroborate ($Sn(BF_4)_2$), derivatives thereof, hydrates thereof or combinations thereof. In another embodiment, to increase the planarization power, the electrolyte can optionally contain an inorganic acid, (e.g., sulfuric acid, phosphoric acid or pyrophosphoric acid), various inorganic supporting salts, and other additives that may be used to improve the quality of plated surfaces (e.g., oxidizers, surfactants, brighteners, etc.). The electrolyte composition can also be based on the alkaline tin plating baths (e.g., glycerin, ammonia, etc) as well. The electrolyte may also contain methane-sulfonic acid (MSA).

In one example, the electrolyte is an aqueous solution that contains between about 200 and 250 g/l of tin sulfate pentahydrate ($SnSO_4.5(H_2O)$), between about 40 and 70 g/l of sulfuric acid ($H_2SO_4$), and about 0.04 g/l of hydrochloric acid (HCl). In some cases it is desirable to add one or more organic additives (e.g., levelers, accelerators, suppressors) to promote uniform growth of the deposited layer. In some cases it is desirable to add a low cost pH adjusting agent, such as potassium hydroxide (KOH) or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In an effort to reduce the production time to form the metal layers 322 and/or 323 it is desirable to take steps to maximize the plating rate, while producing a low stress uniform layer that has good electrical properties. Typical methods that can be used to improve the plating rate include agitation of the electrolyte solution, increase the electrolyte flow and or motion of the substrate in the electrolyte. In one aspect, the plating rate is increased by controlling the temperature of electrolyte. In one embodiment, the temperature of the electrolyte is controlled within a range of about 18° C. and about 85° C., and preferably between about 30° C. and about 70° C. to maximize the plating rate. It has been found that the higher the temperature the faster the plating rate.

Multiple Metallization Steps

The embodiments discussed above in conjunction with FIGS. 2-7 can be used to form one or more of the conductors 325 on a surface of the substrate. While it is generally desirable to form all of the various contact structures used to form a solar cell device at one time, this is sometimes not possible due to various processing constraints. In some cases two metallization processes are required, for example, to form a front side contact, as shown in FIGS. 3A-3E, and a second metallization process to form a second contact on a different region of the metallized substrate 320, such as a backside contact 330 shown in FIG. 3E.

As shown in FIG. 3E, the second metallization step can be used to form the backside contact 330 that is adapted to connect to an active region (e.g., p-type region in FIG. 3A) of the solar cell device. In this example, seed layer 331 can be formed using the process steps described above in conjunction with step 204 or other similar techniques. Next, a metal layer 332 and an interconnect layer 333 may be formed using the process steps described above in conjunction with steps 206-208 and FIGS. 2, 3D-3E, 4, and 7. In one embodiment, the total exposed area of the apertures 413 in the masking plate 410 (FIGS. 4A-4C) used to form the backside contact on the substrate surface is greater than about 65% of the surface area of the backside surface of the substrate. In another embodiment, the total exposed area of the apertures 413 used to form the backside contact on the substrate surface is between about 70% and about 99% of the surface area of the backside surface of the substrate.

Referring to FIG. 2, in one embodiment, an optional seed layer removal step, or step 209, is performed after completing step 208. The seed layer removal step generally entails performing a conventional wet or dry etching step to remove any unwanted and/or excess metal found on the surface of the substrate, such as unused or un-necessary portions of the seed layer 321. Conventional wet etching steps may involve immersing the substrate in an acidic or basic solution that is adapted to remove the unwanted and/or excess metal on the surface of the substrate. In one embodiment, a wet etch chemistry that preferentially etches the seed layer 321 versus the material in the interface layer 323.

Post Processing Steps

Referring to FIG. 2, in step 210 one or more post processing steps are performed to reduce the stress or improve the properties of the deposited metal layers (e.g., metal layers 321, 322, 323, 331, 332, 333). The post processing steps that may be performed during step 210 may be include an anneal step, a clean step, a metrology step or other similar types of processing steps that are commonly performed on after metallizing a surface of the substrate. In one embodiment, an annealing step is performed on the solar cell substrate to reduce or even out the intrinsic stress contained in the formed metal layers. In one aspect, the annealing process is performed at a temperature between about 200 and 450° C. in a low partial pressure of nitrogen environment. In one aspect, an anneal process is used to enhance the electrical contact between the formed metal layers and/or the adhesion of the metal layers to the substrate surface, and silicide formation.

Batch Processing Apparatus

Figure 8A:
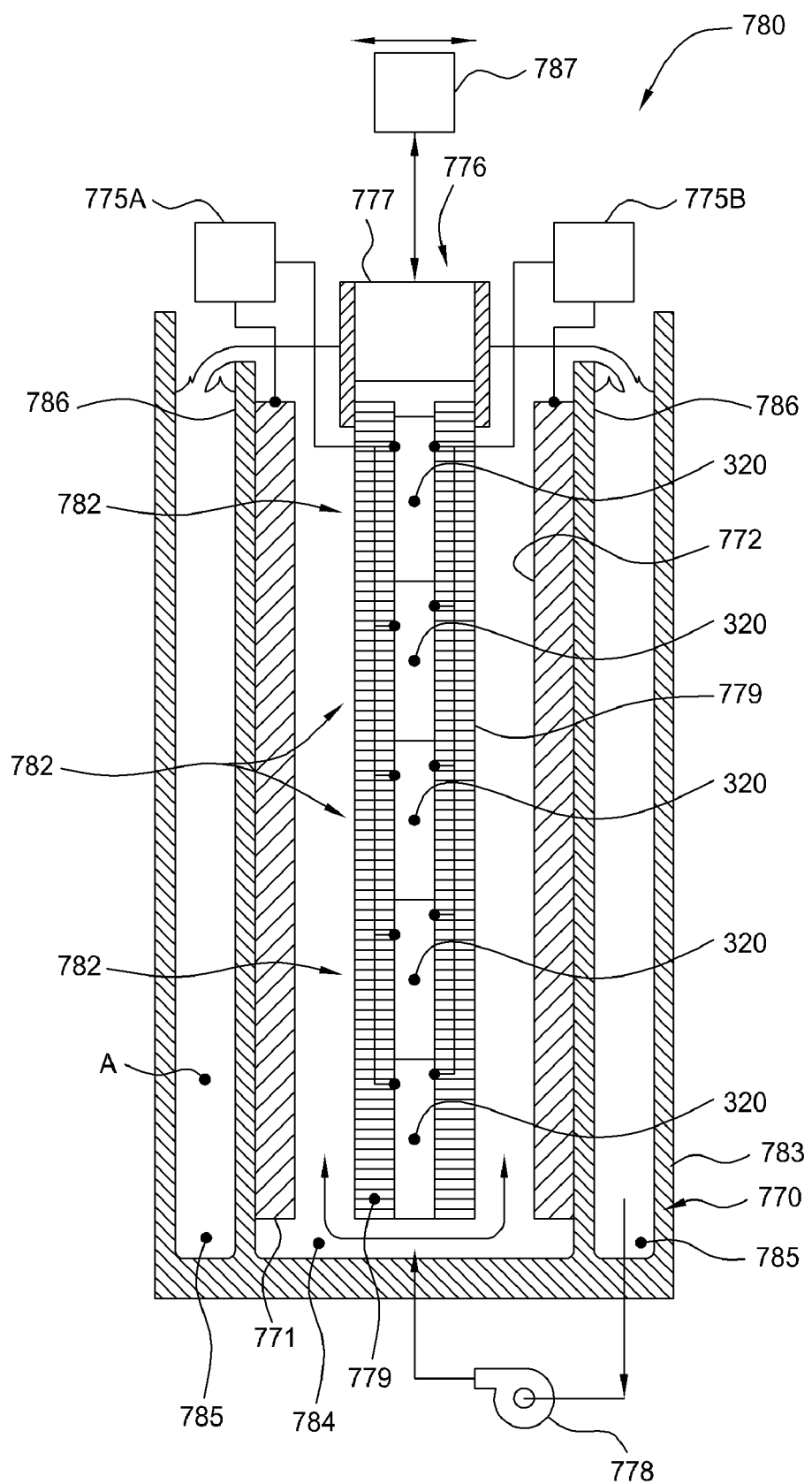
FIG. 8A illustrates a side cross-sectional view of a batch electrochemical deposition chamber according to one embodiment described herein.

In an effort to further increase the substrate throughput through the solar cell plating apparatus, groups of the metallized substrates 320 may be plated at once in a batch type plating operation. FIGS. 8A-8C illustrate one embodiment of a batch plating chamber 780 that is adapted to plate both sides of multiple metallized substrates 320 that are immersed within an electrolyte tank 770. The batch plating chamber 780 may be adapted to sequentially plate each side of multiple metallized substrates 320, or plate both sides of multiple metallized substrates 320 at the same time. FIG. 8A illustrates a side cross-sectional view of a batch plating chamber 780 that is adapted to deposit a metal layer on the surface of the metallized substrates 320 using steps 206 and/or 208, discussed above. The batch plating chamber 780 generally contains a head assembly 776, one or more electrodes (e.g., reference numerals 771, 772), an electrolyte tank 770, and one or more power supplies (e.g., reference numerals 775A, 775B) that are adapted to form one or more conductors 325 on a surface of the metallized substrate 320. While FIG. 8A illustrates a batch plating chamber 780 that contains a plurality of vertically oriented metallized substrates, this configuration is not intended to be limiting as to the scope of the invention. In another aspect, the substrates are oriented horizontally in the batch plating apparatus during the plating process.

FIG. 8B illustrates an isometric view of the head assembly 776 that contains a plurality of cell assemblies 782 that are adapted to retain and preferentially form the conductors 325 on one or more surfaces of the plurality of metallized substrates 320 using an electrochemical plating process. In one embodiment, the cell assemblies 782 contain at least one masking plate assembly 779, an actuator 777, and a support frame 781 that are adapted to hold and make electrical contact to a conductive layer (e.g., seed layer 321) formed on one or more sides of the metallized substrates 320. While the head assembly 776, illustrated in FIG. 8B, contains 20 cell assemblies 782 that contain 20 metallized substrates 320 this configuration is not intended to be limiting to the scope of the invention, since the head assembly 766 could contain two or more cell assemblies 782 without varying from the scope of the invention described herein. In one example, the cell assembly 782 contains between about 2 and about 1000 metallized substrates at one time. While FIGS. 8B-8C illustrate a configuration of the head assembly 776 that is being used to process rectangular shaped metallized substrates 320 this configuration is not intended to be limiting as to the scope of the invention.

In one embodiment, the masking plate assemblies 779 may contain a plurality of masking plates 410 (FIG. 4A) that are held together by a supporting structure (not shown for clarity) that allows each of the masking plates 410 to contact a surface of a metallized substrate so that apertures 413 and contacts 412 (FIG. 4A) contained therein can be used to preferentially form the conductors 325 on a surface of each of the metallized substrates 320. In another embodiment, the masking plate assemblies 779 is a plate, or multiple plates, that are adapted to contact multiple metallized substrates 320 at one time so that apertures 413 formed therein can be used to preferentially form the conductors 325 on the surface of each of the metallized substrates 320.

FIG. 8C illustrates a close-up partial section view of one cell assembly 782 that can be used to form a metal layer on the feature 425 through an aperture 413 formed in the masking plate assembly 779. In one embodiment, the contacts 412 (FIG. 4A) are electrically connected to portions of the support frame 781 so that a bias can be applied to each of the contacts in each of the cell assemblies 782 relative to one of the one or more electrodes 771, 772 by use of a single electrical connection to a single power supply. In another embodiment, discrete electrical connections (not shown for clarity) provided through the masking plate assembly 779 or support frame 781 to each of one or more of the contacts 412 in each of the cell assemblies 782 so that each of the one or more of the contacts 412 can be separately biased relative to one of the one or more electrodes 771, 772 by use of different power supplies.

Referring to FIG. 8A, the electrolyte tank 770 generally contains a cell body 783 and one or more electrodes 771, 772. The cell body 783 comprises a plating region 784 and an electrolyte collection region 785 that contains an electrolyte (e.g., item "A") that is used to electrochemically deposit the metal layer on a conductive region formed on the substrate surface. In one aspect, the electrode 771, 772 are positioned vertically in the plating region 784 and are supported by one ore more of the walls of the cell body 783. In general, it is desirable to increase the surface area of the anode so that high current densities can applied to the electrodes 771, 772 relative to the conductive regions (e.g., seed layer 321 in FIG. 4A) to increase the plating rate. An example of a high surface area electrode that may be used here is discussed above in conjunction with the electrode 420. The electrodes 771, 772 can be formed so that they have a desired shape, such as square, rectangular, circular or oval. The electrodes 771, 772 may be formed from material that is consumable (e.g., copper) during the electroplating reaction, but is more preferably formed from a non-consumable material.

In operation, a metallized substrate 320 is positioned in each of the cell assemblies 782 within the head assembly 776 so that electrical contacts (e.g., reference numerals 412 in FIGS. 4A-4C), found in each cell assembly 782, can be placed in contact with one or more conductive regions on the metallized substrate surface. In one embodiment, the metallized substrates 320 are positioned on the support frame 781 within each cell assembly 782 and then are clamped to the support frame 781 by use of the actuator 777 (e.g., air cylinder) contained in the head assembly 776 so that the masking plate assembly 779 and contacts 412 can contact the substrate surface. In another embodiment, the metallized substrates are placed between opposing masking plate assemblies 779 and then clamped together by use of the actuator 777. After the electrical connection between the contacts and the conductive regions has been made the head assembly 776 is immersed into the electrolyte contained in the electrolyte tank 770 so that a metal layer (e.g., reference numeral 322) can be formed on the conductive regions by biasing them relative to the one or more electrodes 771, 772 using one or more of the power supplies 755A, 775B.

Referring to FIG. 8A, the electrolyte tank 770 may also contain a pump 778 may be adapted to deliver the electrolyte from the electrolyte collection region 785 to the surface of the metallized substrates contained in the head assembly 776. In one embodiment, the pump 778 is adapted to deliver electrolyte to a gap formed between the head assembly 776 and the electrodes 771, 772 and then over a weir 786 and into the electrolyte collection region 785. The fluid motion created by the pump 778 allows the replenishment of the electrolyte components at the exposed regions of the substrates positioned in the head assembly 776. In one embodiment, to reduce the diffusion boundary layer it is desirable to move the head assembly relative to the electrodes 771, 772 during the step 206 by use of an actuator 787. In one embodiment, the actuator 787 comprises an AC motor, piezoelectric device or other similar mechanical component that can impart motion to the head assembly 776.

In one embodiment, the masking plate assemblies 779 may contain a plurality of masking plates 410 (FIG. 4A) that have one or more input channels 466, one or more output channels 467, and one or more electrolyte sources 462 formed therein, which are discussed in conjunction with FIGS. 4D and 4E above.

Figure 8D:
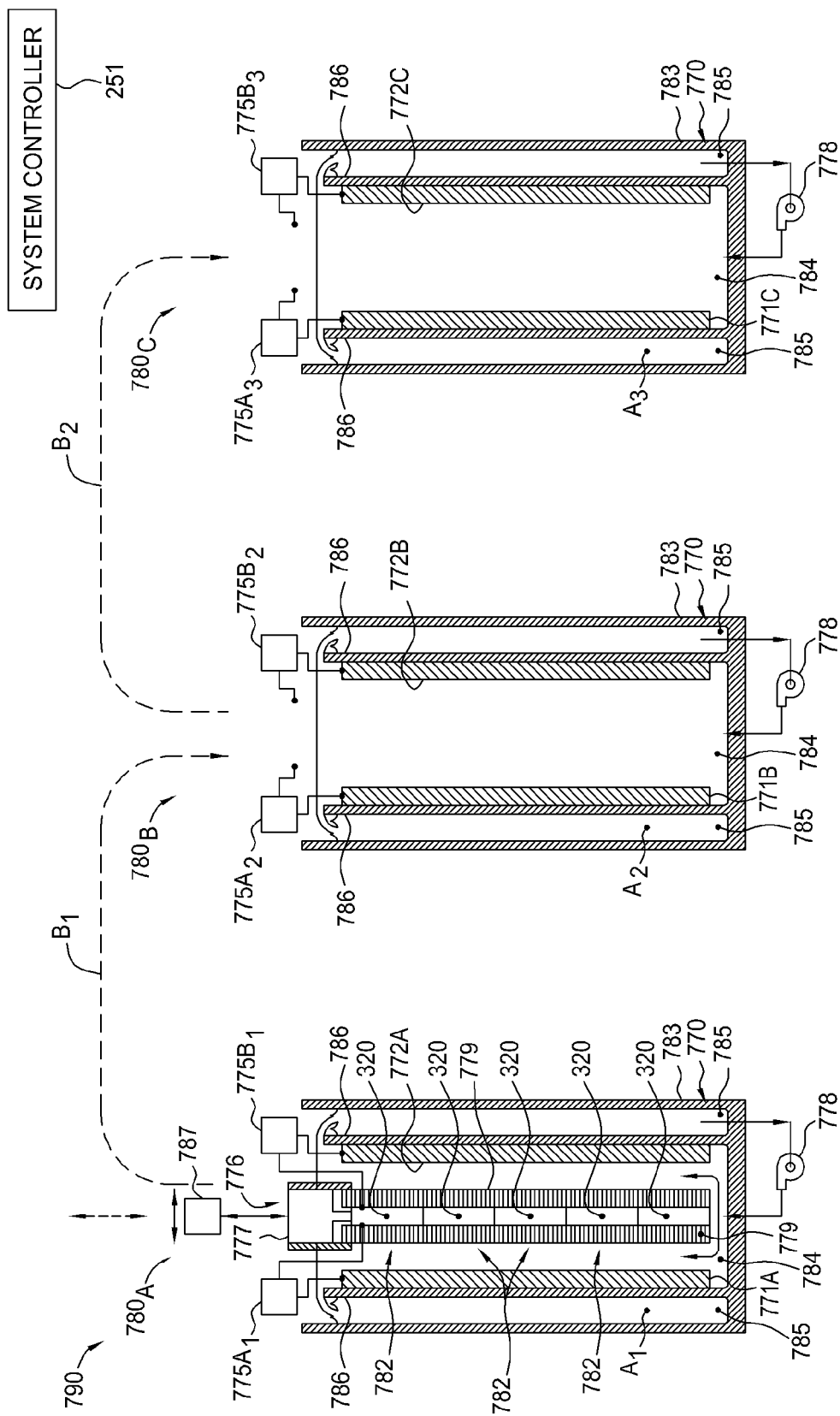
FIG. 8D illustrates a cross-sectional view of a batch electrochemical deposition system according to one embodiment described herein.

FIG. 8D illustrates a side cross-sectional view of a plating system 790 that contains two or more batch plating cells 780 that are positioned near each other so that the substrates positioned in the moveable head assembly 776 can be sequentially plated using different electrolytes or different plating parameters. In operation the head assembly 776 can be sequentially positioned in each of the batch plating cells 780 so that metal layers can be electrochemically deposited on the substrate surface by applying a bias to the individual substrates retained in the head assembly 776 relative to the electrodes 771, 772 contained in the batch plating cells 780. FIG. 8D illustrates, one embodiment that contains three batch plating cells 780A-780C that each contain different electrolytes, such as $A_1$, $A_2$, and $A_3$, respectively. The actuator 787 is a device, such as a conventional robot, gantry crane or similar devices, which can be used to lift and transfer the head assembly 776 between the various batch plating cells 780.

In one embodiment, during operation of the plating system 790 a head assembly 776 that contains one or more metallized substrates 320 is immersed in the first batch plating cell 780A that contains a first electrolyte $A_1$ so that a first metal layer can be formed on the surface of the metallized substrates 320. The one or more metallized substrates 320 contained in the head assembly 776 may be plated by biasing conductive features on the substrate surfaces relative to one or more of the electrodes 771A, 772A positioned in the electrolyte $A_1$ using one or more of the power supplies $775A_1$, $775B_1$. After depositing a desired amount of material on the surface of the substrates the head assembly 776 is transferred following path $B_1$ to an adjacent second batch plating cell 780B so that a second metal layer can be deposited on the surface of the metallized substrates. The metallized substrates 320 contained in the head assembly 776 may be plated by biasing conductive features on the substrate surfaces relative to one or more of the electrodes 771B, 772B positioned in the electrolyte $A_2$ using one or more of the power supplies $775A_2$, $775B_2$. After depositing a second desired amount of material on the surface of the substrates the head assembly 776 is transferred following path $B_2$ to an adjacent third batch plating cell 780C so that a third metal layer can be deposited on the metallized substrate surface. The metallized substrates 320 contained in the head assembly 776 may be plated by biasing conductive features on the substrate surfaces relative to one or more of the electrodes 771C, 772C positioned in the electrolyte $A_3$ using one or more of the power supplies $775A_3$, $775B_3$. In one embodiment, it may be desirable to rinse the components contained within head assembly 776, including the metallized substrates, with DI water between plating steps to reduce the "drag-out" contamination of the subsequent electrolytes with electrolytes used in prior processes.

Figure 8E:
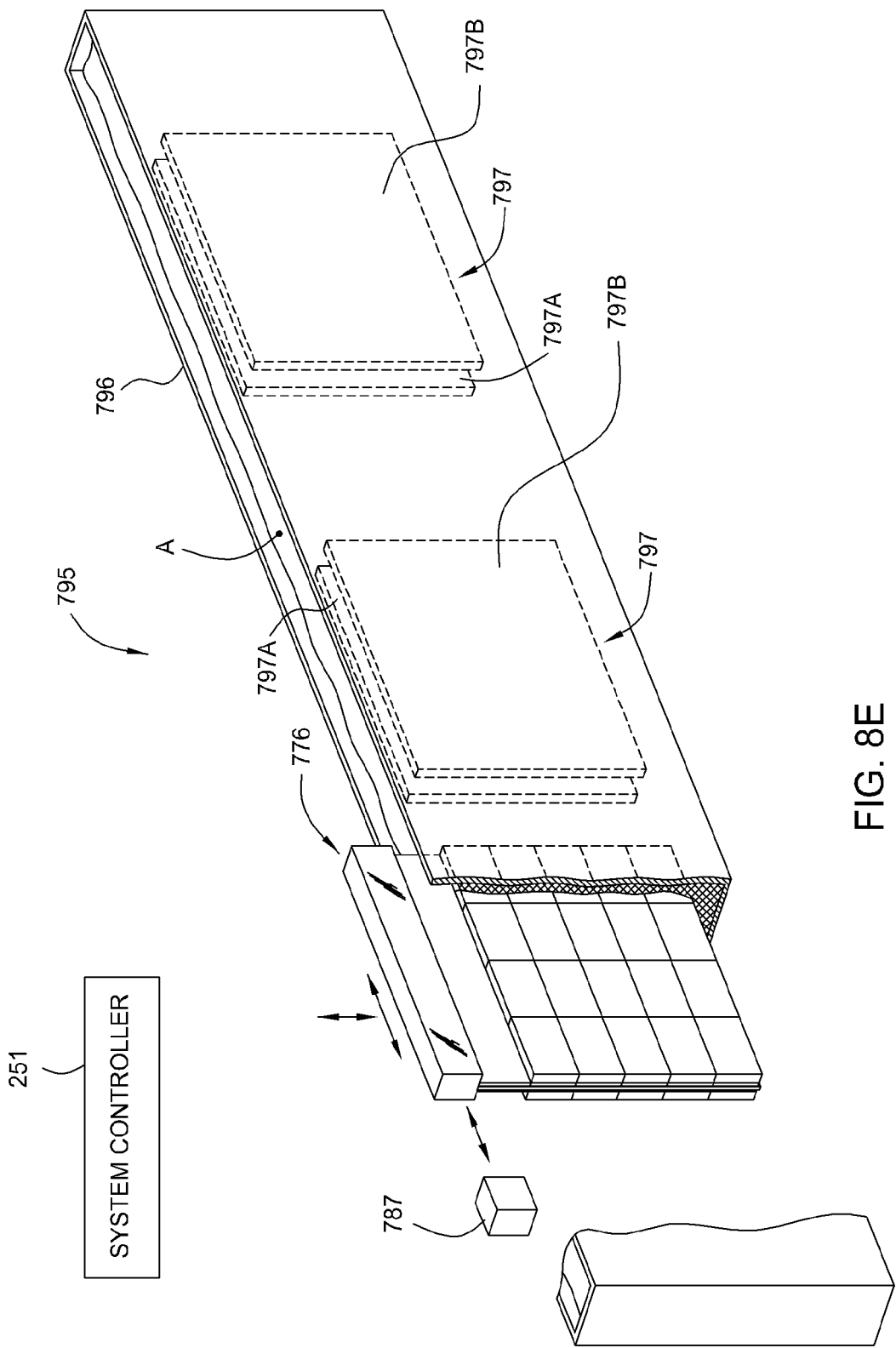
FIG. 8E illustrates an isometric view of a batch electrochemical deposition system according to one embodiment described herein.

FIG. 8E illustrates a side partial-sectional view of a plating system 795 that contains an electrolyte tank 796 that allows the substrates positioned in a head assembly 776 to be sequentially plated by positioning the head assembly 776 near two or more electrode assemblies 797 positioned in the electrolyte tank 796. In this configuration the substrates contained in the head assembly 776 are positioned within a single electrolyte "A" that is used in conjunction with a two or more electrode assemblies 797 to sequentially plate the substrates using different plating parameters (e.g., local electrolyte flow rate, current density). In operation, the metallized substrates 320 positioned in the head assembly 776 can be plated by positioning them near or slowly transferring them past each of the electrode assemblies 797 that are biased relative to the conductive features on the substrate surface. In one aspect, one or more of the plating parameters are varied as the head assembly 776 are positioned near different electrode assemblies 797. In one embodiment, both sides of a substrate are plated by electrically biasing a first electrode 797A positioned on one side of the head assembly 767 and by electrically biasing a second electrode 797B positioned on the other side of the head assembly 767 relative to the conductive features formed on the substrate surface using one or more power supplies (not shown) and the system controller 251. The actuator 787 is a device, such as a conventional robot, gantry crane or similar devices, that can be used to transfer the head assembly 776 "in" and "out" of the electrolyte tank 796 and near the various electrode assemblies 797. In this configuration multiple head assemblies 776 can be inserted into the electrolyte tank 796 at one time to allow for a more seamless "assembly line" type process flow through the various different process steps that may be used to form the conductors 325 on the surface of the substrates contained in each of the head assembly 776.

Alternate Deposition Techniques Using a Masking Plate

Figure 9:
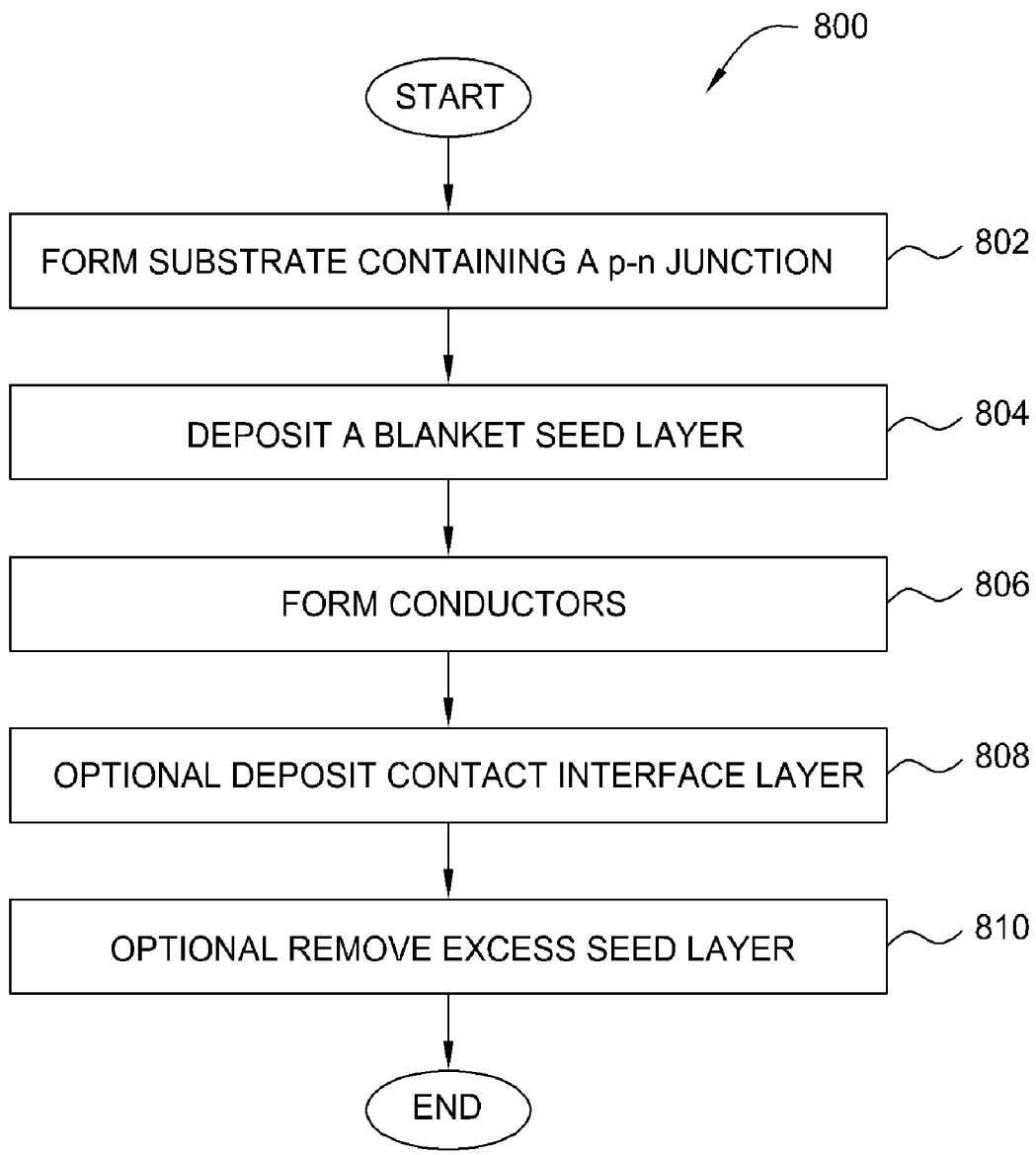
FIG. 9 illustrates a solar cell process sequence according to one embodiment described herein.

FIG. 9 illustrates a series of method steps 800 that are used to form metal contact structures on a solar cell device using the apparatus described herein. The processes described below may be used to form a solar cell having interconnects formed using any conventional device interconnection technique. Thus while the embodiments described herein are discussed in conjunction with the formation of a device that has the electrical contacts to the n-type and p-type junctions on opposing sides of the substrate this interconnect configuration is not intended to be limiting as to the scope of the invention, since other device configurations, such as PUM or multilayer buried contact structures (both contacts on one side), may be formed using the apparatus and methods described herein without varying from the basic scope of the invention.

Figure 10A:
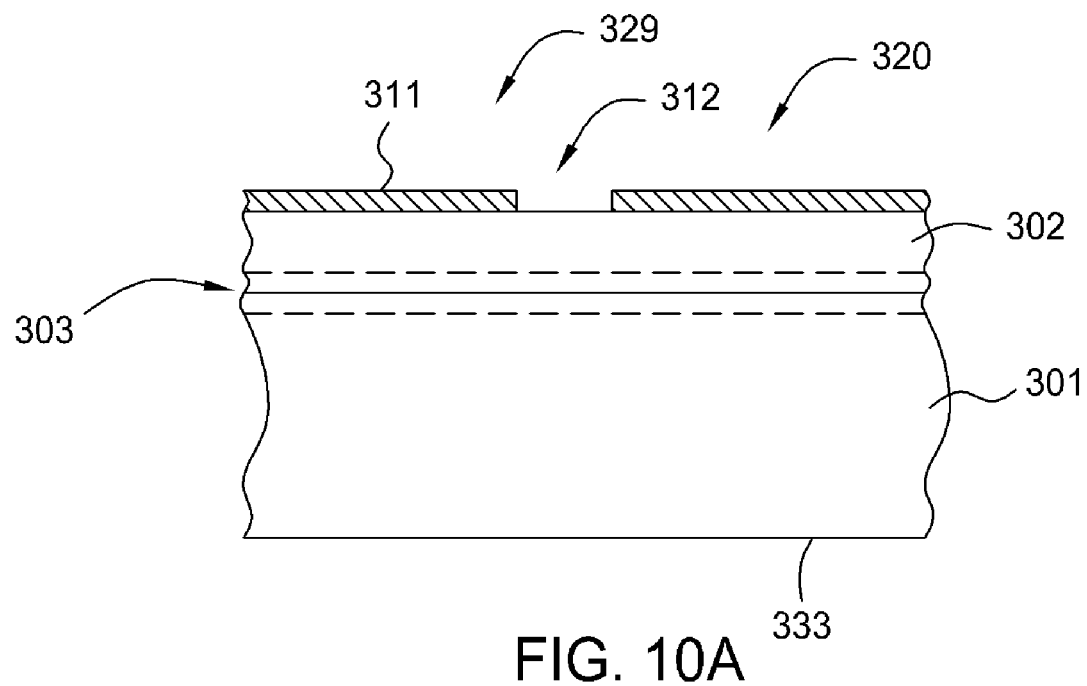
FIGS. 10A-10E illustrate schematic cross-sectional views of a solar cell during different stages of the process sequence described in FIG. 9.
Figure 10B:
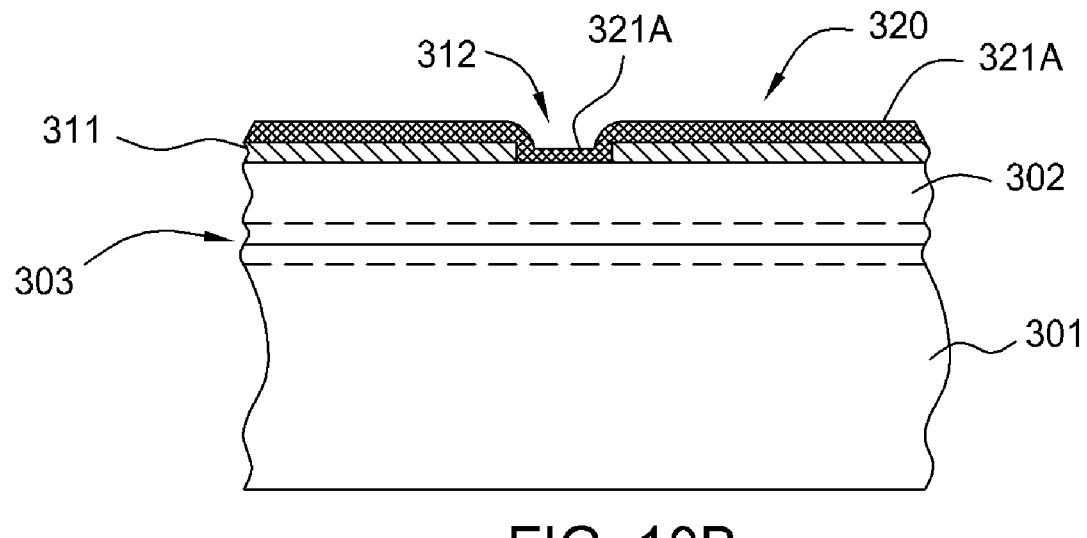

FIGS. 10A-10E illustrate the various states of a metallized substrate 320 after each step of method steps 800 has been performed. The method steps 800 start with step 802 in which a substrate 301 (FIG. 10A) is formed using conventional solar cell and/or semiconductor fabrication techniques. The substrate 301 may be formed using the steps described in step 202, discussed above. Referring to FIGS. 9 and 10B, in the next step, step 804, a blanket seed layer 321A is deposited over the surface of the substrate 301. In general, a blanket seed layer 321A may be deposited using a physical vapor deposition (PVD), chemical vapor deposition (CVD), molecular beam epitaxy (MBE), or atomic layer deposition (ALD) process.

Figure 10C:
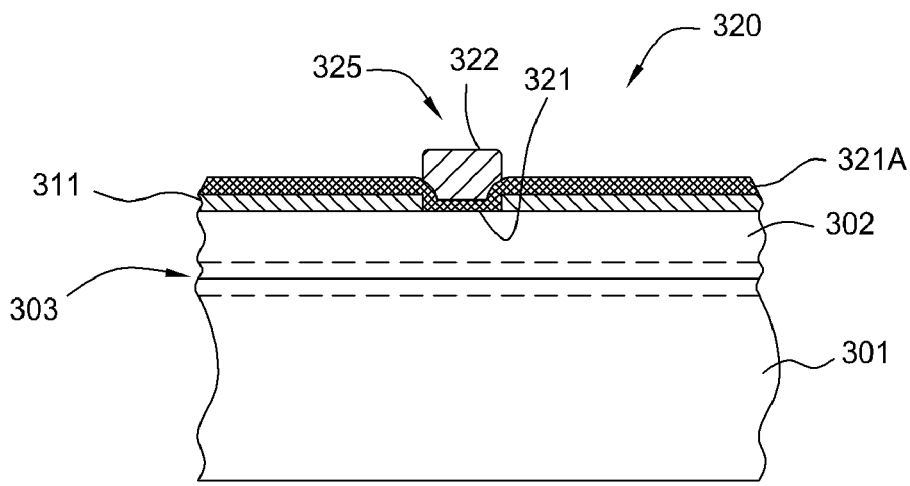

In the next step, step 806, the masking plate 410 (FIGS. 4A-4E) is used to mask regions of the blanket seed layer 321A and preferentially expose regions of the blanket seed layer 321A where the metal layer 322 of the conductors 325 are to be formed. Referring to FIG. 10C, during the step 806 an aperture (i.e., aperture 413 in FIG. 4A-4E) in the masking plate (reference numeral 410 in FIGS. 4A-4E) is positioned over a portion of the blanket seed layer 321A so that a conductor 325 can be formed thereon using of the apparatuses, chemicals and methods discussed in conjunction with step 206 above. In this process step, the blanket seed layer 321A is cathodically biased relative to an electrode (reference numeral 420 in FIGS. 4A-4E) using a power supply that causes the ions in an electrolyte to form a metal layer 322 on the exposed areas of the blanket seed layer 321A created within the apertures in the masking plate.

Figure 10D:
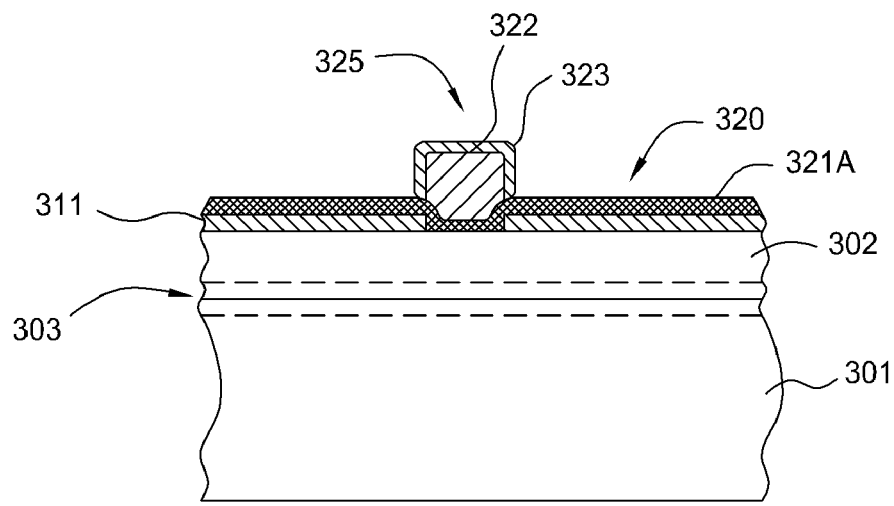

Referring to FIGS. 9 and 10D, in step 808, an optional contact interface layer 323 is deposited over the surface of the metal layer 322 formed during step 806. The contact interface layer 323 can be formed using an electrochemical deposition process that utilizes a masking plate (reference numeral 410 in FIGS. 4A-4E) to preferentially form an interface layer 323 over the metal layer 322 formed in step 806. The interface layer 323 formed in step 808 may be formed using the apparatus, chemicals and methods described above in conjunction with step 208.

Figure 10E:
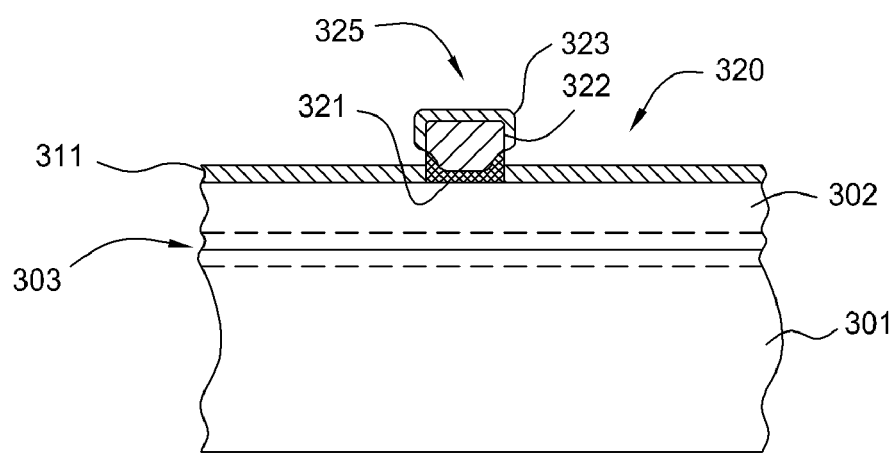

Finally, in step 810, as shown in FIG. 10E, the blanket seed layer 321A is removed from surface of the substrate. The blanket seed layer removal step generally entails performing a conventional wet or dry etching step to remove any unwanted and/or excess metal found on the surface of the substrate, such as unused portions of the blanket seed layer 321A. Conventional wet etching steps may involve immersing the substrate in an acidic or basic solution that is adapted to remove the unwanted and/or excess metal on the surface of the substrate. In one embodiment, a wet etch chemistry that preferentially etches the seed layer 321A versus the material in the interface layer 323 is used. In one embodiment, a backside metallization process is performed on the metallized substrate 320 after step 810 by use of a process similar to the one discussed above in conjunction the FIG. 3F, described above.

In an alternate embodiment, step 810 is performed prior to performing step 808. In this configuration, after the excess blanket seed layer 321A is removed from the surface of the metallized substrate 321A, thus leaving the metal layer 322 or a good portion thereof, so that the interface layer 323 can be preferentially formed on the metal layer 322 using an electroless deposition process, a conventional selective CVD deposition process, electrochemical deposition process, or other comparable deposition processes.

Solar Cell Interconnect Formation

Figure 11:
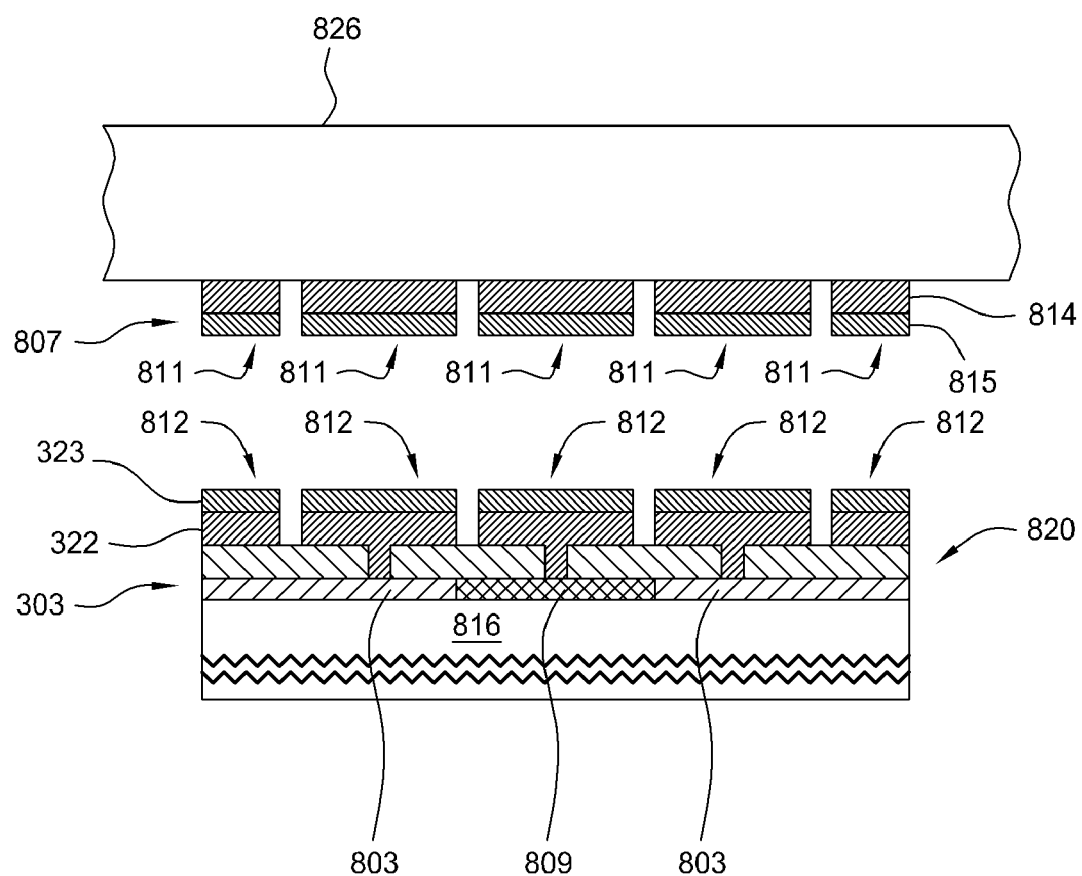
FIG. 11 illustrate schematic cross-sectional views of a metallized substrate and interconnecting element according to one embodiment described herein.

To form a useful solar cell device it is common to connect multiple solar cells together to form a solar cell array that can deliver a desired voltage and/or current to drive an external load. In one embodiment, solar cell devices formed by use of the method steps 200, method steps 800, or other similar process sequence, are connected together so that they form a solar cell array that is able to convert sunlight directly into usable electrical power. A solar cell array can be connected either in parallel or series depending upon the design objective or design application. FIG. 11 generally illustrates a solar cell array that may be formed by bringing an interconnecting element 807 in contact with the electrical contacts 811 of the solar cells formed on one or more rigid or flexible substrates. One will note that the interconnecting element 807 and electrical contacts 811 are shown in a separated configuration in FIG. 11 to clearly identify the features of each component.

FIG. 11 illustrates a side cross-sectional view of a metallized substrate 820 and an interconnecting element 807 that is formed on a base 826. The interconnecting element 807 is generally used to interconnect the solar cell devices formed on the metallized substrate 820. In one embodiment, the metallized substrate 820 comprises a metallized substrate 320 formed following the method steps 200 or method steps 800, discussed above. In general, the metallized substrates 820 may contain a plurality of electrical contacts 812 that are connected to the active region 303 of a solar cell device. In one embodiment, the electrical contacts 812 have a metal layer 322 and an interface layer 323 that have been formed using the processes described above. In one embodiment of the metallized substrate 820, the active region 303 of the metallized substrate 820 contains a first doped region 809, such as a p+ doped region, that is horizontally positioned next to a second doped region 803, such as an n+ doped region, that are both positioned on a base material 816 that may be an n-type region. While FIG. 11 illustrates a metallized substrate that contains an active region 303 that is oriented horizontally, versus vertically as shown herein (e.g., FIG. 3A-3I), this is not intended to be limiting as to the scope of the invention.

In one embodiment, the interconnecting element 807 generally contains a patterned electrically conductive structure that is formed on the base 826, which can be joined with portions of the metallized substrate 820 to connect desired elements of multiple solar cell devices. The interconnecting element 807 generally contains a plurality of electrical interconnects 811 that are formed on a base 826 using an electroless deposition process, a conventional PVD process or a conventional CVD process, or one or more of the processes described in steps 204-208 above. The pattern or shape of the electrical interconnects 811 is set by the design of the metallized substrate 820 and the interconnect design. In one embodiment, the electrical interconnects 811 is formed by following one or more of the techniques discussed above in conjunction with the method steps 200 or 800. In one aspect, the electrical interconnects 811 is formed using steps 204-206 or steps 804-806. In one embodiment, the electrical interconnects 811 contain a metal layer 814 and an interface layer 815, where the metal layer 814 may contain a conductive metal, such as a copper, nickel, aluminum, silver, or gold, and the interfacial layer 815 may contain a conductive metal, such as tin, silver, gold, lead, or ruthenium. In one embodiment, two or more of the electrical interconnects 811 formed on the base 826 may be electrically connected together (not shown) so that a solar cell array can be formed when the devices in the metallized substrate 820 are placed in contact with the electrical interconnects 811. The base 826 may be formed from polymeric materials (e.g., polyimide, PET, PEN, silicones, epoxy resin, polyesters), coated metal, glass, silicon or other similar non-electrically conductive materials.

While the foregoing is directed to embodiments of the present invention, other and further embodiments of the invention may be devised without departing from the basic scope thereof, and the scope thereof is determined by the claims that follow.

What is claimed is:

1. An apparatus for forming a metal layer on a solar cell substrate, comprising:
    a masking plate having a body, a first surface, a second surface and a plurality of apertures that extend through the body between the first surface and the second surface;
    a contact that is in communication with a power supply;
    a thrust plate that is adapted to urge a metallized surface of the substrate against the contact and the first surface of the masking plate; and
    an electrode that is in electrical communication with the power supply.

2. The apparatus of claim 1, further comprising a pump that is adapted to deliver an electrolyte to space formed between a portion of a seed layer exposed by the apertures and the electrode.

3. The apparatus of claim 1, wherein the masking plate further comprises at least one inlet port that is in fluid communication with each aperture formed in the masking plate, wherein the at least one inlet port is in fluid communication with the openings created by the aperture at the first surface and the second surface.

4. The apparatus of claim 1, further comprising:
    a first fluid source that is adapted to deliver a copper ion containing electrolyte to the surface of the substrate and the electrode; and
    a second fluid source that is adapted to deliver a metal ion containing electrolyte to the surface of the substrate and the electrode, wherein the metal ion is selected from a group consisting of silver, nickel, zinc, or tin.

5. The apparatus of claim 1, wherein masking plate is formed from a material selected from a group consisting of glass, plastic and ceramic.

6. The apparatus of claim 1, wherein the metallized surface is on a non-light receiving side of the solar cell substrate and the sum of the cross-sectional areas of the apertures at the first surface of the masking plate is greater than 65% of the surface area of the non-light receiving side of the solar cell substrate.

7. The apparatus of claim 1, wherein the metallized surface is on a light receiving side of the solar cell substrate and the sum of the cross-sectional areas of the apertures at the first surface is less than about 30% of the surface area of the light receiving side of the solar cell substrate.

8. An apparatus for forming a metal layer on a solar cell substrate, comprising:
    a masking plate having a body, a first surface, a second surface and a plurality of apertures that extend through the body between the first surface and the second surface;
    a contact that is in communication with a power supply;
    a thrust plate that is adapted to urge a substrate against the contact and the first surface of the masking plate; and
    an electrode that is in electrical communication with the power supply and that is sealably connected to masking plate so that a plurality of processing volumes are formed by a surface of the electrode and the apertures formed in the masking plate.

9. The apparatus of claim 8, further comprising a pump that is adapted to deliver an electrolyte to space formed between a portion of a seed layer exposed by the apertures and the electrode.

10. The apparatus of claim 8, wherein the masking plate further comprises at least one inlet port that is in fluid communication with each aperture formed in the masking plate, wherein the at least one inlet port is in fluid communication with the openings created by the aperture at the first surface and the second surface.

11. The apparatus of claim 8, wherein electrode is formed from a material selected from a group consisting of titanium, platinum, copper and phosphorus.

12. The apparatus of claim 8, further comprising:
    a first fluid source that is adapted to deliver a copper ion containing electrolyte to the surface of the substrate and the electrode; and
    a second fluid source that is adapted to deliver a metal ion containing electrolyte to the surface of the substrate and the electrode, wherein the metal ion is selected from a group consisting of silver, nickel, zinc, or tin.

13. The apparatus of claim 8, wherein masking plate is formed from a material selected from a group consisting of glass, plastic and ceramic.

14. An apparatus for forming a metal layer on a solar cell substrate, comprising:
    a contact that is in electrical communication with a power supply;
    a masking plate having a body, a first surface, a second surface, wherein the masking plate comprises:

a plurality of apertures that extend through the body between the first surface and the second surface, wherein each of the plurality of apertures have a sidewall surface; and a plurality of inlet channels, wherein each of the plurality of apertures is in fluid communication with at least one inlet channel and each inlet channel has an inlet port which is in fluid communication with the sidewall surface; and a first electrolyte source that is in fluid communication with at least one of the plurality of inlet channels;

a thrust plate that is adapted to urge a substrate against the contact and the first surface of the masking plate; and an electrode that is in electrical communication with the power supply.

15. The apparatus of claim 14, wherein the apertures further comprise an outlet channel that has an outlet port which is in communication with the sidewall surface.

16. The apparatus of claim 14, further comprising a second electrolyte source that is in fluid communication with at least one of the plurality of inlet channels, wherein the second electrolyte source is adapted to deliver an electrolyte that contains at least one component that is different than an electrolyte delivered from the first electrolyte source.

17. The apparatus of claim 16, wherein the first electrolyte source that is adapted to deliver a copper ion containing electrolyte to the surface of the substrate and the electrode and the second electrolyte source that is adapted to deliver a metal ion containing electrolyte to the surface of the substrate and the electrode, wherein the metal ion is selected from a group consisting of silver, nickel, zinc, or tin.

18. The apparatus of claim 14, wherein masking plate is formed from a material selected from a group consisting of glass, plastic and ceramic.

19. A method of forming a metal layer on a solar cell substrate, comprising:
positioning a substrate that has a seed layer that is in electrical communication with a n-type region or a p-type region formed on a substrate in a processing apparatus;
disposing a masking plate having a plurality of apertures formed therein over the surface and at least a portion of the seed layer;
contacting the seed layer with one or more electrical contacts; and
forming a first metal layer over the seed layer by immersing the seed layer and an electrode in a first electrolyte and biasing the electrical contacts relative to the electrode using a power supply, wherein the first metal layer is formed within the areas exposed by apertures formed in the masking plate.

20. The method of claim 19, wherein the first electrolyte contains a copper salt selected from a group consisting of copper sulfate, copper chloride, copper acetate, copper pyrophosphate, and copper fluoroborate.

21. The method of claim 19, wherein first metal layer comprises copper and at least one element selected from a group consisting of silver, nickel, zinc and tin.

22. The method of claim 19, further comprising forming a second metal layer over the first metal layer by immersing the first metal layer and an electrode in a second electrolyte and biasing the first metal layer relative to the electrode using one or more waveforms delivered from a power supply.

23. The method of claim 22, wherein the second electrolyte contains a metal ion selected from a group consisting of tin, silver, copper, gold, lead and ruthenium.

24. The method of claim 19, wherein the metallized surface is on a non-light receiving side of the solar cell substrate and the sum of the cross-sectional areas of the apertures at the first surface of the masking plate is greater than 65% of the surface area of the non-light receiving side of the solar cell substrate.

25. The method of claim 19, wherein the metallized surface is on a light receiving side of the solar cell substrate and the sum of the cross-sectional areas of the apertures at the first surface of the masking plate is less than 30% of the surface area of the light receiving side of the solar cell substrate.

* * * * *

UNITED STATES PATENT AND TRADEMARK OFFICE
CERTIFICATE OF CORRECTION

PATENT NO. : 7,736,928 B2  Page 1 of 1
APPLICATION NO. : 11/566205
DATED : June 15, 2010
INVENTOR(S) : Lopatin et al.

It is certified that error appears in the above-identified patent and that said Letters Patent is hereby corrected as shown below:

In the Detailed Description:

Column 14, Line 51, please delete "($CuSO_4.5(H_2O)$)" and insert --($CuSO_4 \cdot 5(H_2O)$)-- therefor;

Column 15, Line 6, please delete "($CuSO_4.5(H_2O)$)" and insert --($CuSO_4 \cdot 5(H_2O)$)-- therefor;

Column 15, Line 9, please delete "($C_7H_5O_6SNa.2H_2O$)" and insert --($C_7H_5O_6SNa \cdot 2H_2O$)-- therefor;

Column 15, Line 18, please delete "($CuSO_4.5(H_2O)$)" and insert --($CuSO_4 \cdot 5(H_2O)$)-- therefor;

Column 15, Line 20, please delete "($Na_4P_2O_7.10(H_2O)$)" and insert --($Na_4P_2O_7 \cdot 10(H_2O)$)-- therefor;

Column 15, Line 55, please delete "Laver" and insert --Layer-- therefor;

Column 16, Line 47, please delete "($SnSO_4.5(H_2O)$)" and insert --($SnSO_4 \cdot 5(H_2O)$)-- therefor.

Signed and Sealed this

Twenty-eighth Day of September, 2010

David J. Kappos
*Director of the United States Patent and Trademark Office*